United States Patent
Hongo

(10) Patent No.: US 7,170,345 B2
(45) Date of Patent: Jan. 30, 2007

(54) PREDISTORTER

(75) Inventor: Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 200 days.

(21) Appl. No.: 11/073,694

(22) Filed: Mar. 8, 2005

(65) Prior Publication Data

US 2005/0258898 A1 Nov. 24, 2005

(30) Foreign Application Priority Data

May 19, 2004 (JP) ............................. 2004-149217

(51) Int. Cl.
*H03F 1/26* (2006.01)
(52) U.S. Cl. ...................... 330/149; 330/291; 330/278
(58) Field of Classification Search ................ 330/149, 330/291, 278
See application file for complete search history.

(56) References Cited

U.S. PATENT DOCUMENTS

| 5,164,678 A | 11/1992 | Puri et al. |
| 5,606,286 A * | 2/1997 | Bains .......................... 330/149 |
| 5,770,971 A * | 6/1998 | McNicol ...................... 330/52 |
| 5,781,069 A * | 7/1998 | Baskin ........................ 330/149 |
| 6,545,535 B2 * | 4/2003 | Andre .......................... 330/149 |
| 6,703,897 B2 * | 3/2004 | O'Flaherty et al. ......... 330/149 |
| 6,809,587 B2 * | 10/2004 | Ghannouchi et al. ....... 330/149 |

FOREIGN PATENT DOCUMENTS

| WO | 94/14238 | 6/1994 |
| WO | 98/28888 | 7/1998 |

* cited by examiner

*Primary Examiner*—Patricia Nguyen
(74) *Attorney, Agent, or Firm*—Wenderoth, Lind & Ponack, L.L.P.

(57) ABSTRACT

To provide a predistorter compensating for distortion generated at an amplifier by inputting a signal to be inputted to the amplifier constituting an object of compensating for the distortion and previously providing the distortion to the input signal. Amplifier replica means is provided with an input/output characteristic the same as an input/output characteristic of an amplifier or an input/output characteristic approximated thereto and inputs a signal to output. Difference detecting means detects a difference between an input signal to a predistorter and an output signal from the amplifier replica means. Amplifier replica input signal changing means changes a signal inputted to the amplifier replica means such that the difference detected by the difference detecting means is reduced. Change signal outputting means outputs a signal changed by the amplifier replica input signal changing means to the amplifier.

14 Claims, 11 Drawing Sheets

PREDISTORTER

BACKGROUND OF THE INVENTION

1. Field of the Invention

The present invention relates to a predistorter used in, for example, an amplifier apparatus having a predistortion system distortion compensating function for compensating for a distortion generated in an amplifier in amplifying an input signal by the amplifier by a predistortion system, particularly relates to a predistoter for compensating for a nonlinear distortion by a memory effect generated at an amplifier.

2. Description of Related Art

In, for example, a base station apparatus of a mobile communication system, at an amplifying portion of a transmitter, a signal constituting an object of transmission is amplified by an amplifier. Further, a nonlinear distortion is generated at the amplifier in accordance with a level of an input signal or the like and therefore, a distortion is compensated for by a predistortion system or the like.

Patent Reference 1: JP-T-2001-507196
Patent Reference 2: JP-T-8-504550
Patent Reference 3: Japanese Patent Publication No. 3051984
Patent Reference 4: Japanese Patent Publication No. 32293335
Patent Reference 5: U.S. Pat. No. 5,164,678
Nonpatent Reference 1: Kawaguchi, Akaiwa "Nonlinearity Compensation with Adaptive Predistorter for an Amplifier Affected by Even-order Distortion", Shingaku Giho, MW2002-208 (2003-03) p. 63–66

However, according to the predistortion system of the background art, there is a drawback that it is not sufficient yet to effectively compensate for both of a nonlinear distortion by AM (Amplitude)— AM (Amplitude) conversion and AM (Amplitude)— PM (Phase) conversion and a distortion by a memory effect.

SUMMARY OF THE INVENTION

The invention has been carried out in view of such a situation of the background art and it is an object thereof to provide a predistorter capable of effectively compensating for a nonlinear distortion by AM-AM conversion and AM-PM conversion and a distortion generated by being affected by a distortion represented by, for example, a memory effect other than the nonlinear distortion.

In order to achieve the above-described object, according to a predistorter of the invention, the following processing is executed in inputting a signal to be inputted to an amplifier constituting an object of compensating for a distortion, previously providing the distortion to the input signal and compensating for the distortion generated at the amplifier.

That is, amplifier replica means is provided with an input/output characteristic the same as an input/output characteristic of the amplifier or an input/output characteristic approximated thereto and inputs a signal to output. Difference detecting means detects a difference between an input signal to the predistorter and an output signal from the amplifier replica means. Amplifier replica input signal changing means changes a signal inputted to the amplifier replica means such that the difference detected by the difference detecting means is reduced. Change signal outputting means outputs a signal changed by the amplifier replica input signal changing means to the amplifier.

Further, in this case, the signal changed by the amplifier replica input signal changing means to be outputted to the amplifier corresponds to a previously distorted signal.

Therefore, the input signal to an input/output characteristic is changed such that a difference between an output signal and an input signal to the predistorter which are inputted and outputted by an input/output characteristic the same as or approximated to the input/output characteristic of the amplifier constituting the object of compensating for the distortion and the changed signal is outputted to the amplifier and therefore, the distortion received due to the input/output characteristic of the amplifier becomes zero (0) or reduced, thereby, with regard to the amplifier, both of a nonlinear distortion by an AM-AM conversion and an AM-PM conversion and a distortion by a memory effect can effectively compensated for.

Here, as the amplifier constituting the object of compensating for the distortion, various amplifiers may be used.

Further, the predistorter is normally provided at a prestage of the amplifier constituting the object of compensating for the distortion and previously distorts a signal before being inputted to the amplifier constituting the object of compensating for the distortion.

Further, although it is preferable that the input/output characteristic of the amplifier replica means is approximated to, for example, the input/output characteristic of the amplifier constituting the object of compensating for the distortion, ones having various accuracies may be used and various amplifier models may be used, if they are actually efficient.

Further, as the input/output characteristic of the amplifier replica means, for example, one having a gain of 1 may be used, or there may be used a constitution in which signal level changing means of an amplifier, an attenuator or the like having a gain of (1/G) may be provided before or after the amplifier replica means having a gain of G and the gain becomes 1 by combining the gains.

Further, a processing of changing a signal inputted to the amplifier replica means based on a result of detection by the difference detecting means to output to the amplifier constituting the object of compensating for the distortion is executed, for example, for each section of the input signal to the predistortor and is executed at each sampling period as an example.

Further, in changing the signal inputted to the amplifier replica means by the amplifier replica input signal changing means, as a signal initially inputted to the amplifier replica means, for example, the input signal to the predistorter may be used, or other signal may be used.

As a constitution example, it is possible to provide subpredistorter means for providing a predistortion to the input signal to the predistorter and inputting the signal provided with the predistortion initially to the amplifier replica means. In this case, by providing the predistortion initially, for example, a processing amount or a processing time period required until reducing the difference detected by the difference detecting means can be reduced. As the predisotrtion, various ones may be used, for example, a previously set distortion may be used, for example, one having comparatively rough accuracy may be used.

Further, as a mode of reducing the difference detected by the difference detecting means, for example, although a mode of minimizing the difference may preferably be used, various modes may used.

Further, as a mode of changing the signal inputted to the amplifier replica means by the amplifier replica input signal changing means, for example, a mode of changing the signal by a predetermined number of times, a mode of changing the signal by a predetermined time period, a mode of changing the signal until determining that the difference detected by the difference detecting means becomes equal to or less than a predetermined threshold can be used. Further, the change signal outputting means outputs, for example, a signal constituting a result of being changed by such a mode by the amplifier replica input signal changing means to the amplifier constituting the object of compensating for the distortion.

According to the predistorter of the invention, as a constitution example, the following processing is executed.

That is, the distortion detecting means detects the distortion included in the signal based on the signal outputted from the amplifier. The amplifier replica parameter updating means updates a parameter of changing an input/output characteristic provided to the amplifier replica means such that the distortion detected by the distortion detecting means is reduced.

Therefore, the input/output characteristic of the amplifier replica means is changed by updating the parameter such that the distortion included in an amplifying signal outputted from the amplifier constituting the object of compensating for the distortion is reduced and therefore, accuracy of compensating for the distortion can be promoted by making the input/output characteristic of the amplifier replica means approximated to a proper characteristic.

Here, the distortion included in the signal outputted from the amplifier constituting the object of compensating for the distortion corresponds to a distortion remaining without being compensated for by the predistorter.

Further, as a mode of reducing the distortion detected by the distortion detecting means, for example, although it is preferable to use a mode of minimizing the distortion, various modes may be used.

Further, as a parameter changing the input/output characteristic provided to the amplifier replica means, various modes may be used, for example, in accordance with the model constitution of the amplifier, a table value representing a characteristic by AM-AM conversion, a table value representing a characteristic by AM-PM conversion, a table value representing a characteristic by a memory effect, a predetermined operational coefficient, an amount of changing a predetermined physical amount of a phase or the like can be used.

The predistorter according to the invention is constituted as follows as a constitution example.

That is, the input signal to the preditorter is a signal of a base band or an intermediate frequency.

The amplifier is an amplifier for transmitting a radio wave.

The amplifier replica means includes a function of realizing a characteristic the same as the AM-AM characteristic and the AM-PM characteristic of the amplifier or a characteristic approximated thereto, and a function of realizing a characteristic the same as the characteristic of the memory effect of the amplifier or a characteristic approximated thereto.

Further, the amplifier replica means is provided with a characteristic that a mean gain is at a zero decibel or substantially at a zero decibel as an input/output characteristic the same as an input/output characteristic of the amplifier or an input/output characteristic approximated thereto.

According to the predistorter, a plurality of distortion compensating units having the amplifier replica means, the difference detecting means, and the amplifier replica input signal changing means are provided to connect in series.

Further, the change signal outputting means outputs a signal changed by the amplifier replica input signal changing means of a final stage of the distortion compensating unit of the amplifier.

Further, according to the predistorter, subpredistorter means provides a predistortion to the input signal at each sampling period of the input signal to the predistorter and constitutes the signal provided with the predistortion as the input signal to the amplifier replica means of an initial stage of the distortion compensating unit.

Therefore, since the processing is executed successively by the plurality of distortion compensating units connected in series, in comparison with, for example, a case of repeatedly executing similar processings by constituting the signal distortion compensating unit, a processing speed necessary for each distortion compensating unit can be reduced.

Here, as a member of the plurality of distortion compensating units, various numbers may be used.

Further, as the predistortion provided by the subpredistorter means, various distortions may be used, for example, a previously set distortion may be used, or a distortion having comparatively rough accuracy may be used.

As has been explained above, according to the predistorter of the invention, there is provided the amplifier replica function having the input/output characteristic the same as the input/output characteristic of the amplifier constituting the object of compensating for the distortion or the input/output characteristic approximated thereto for inputting the signal to output, the difference between the input signal to the predistorter and the output signal from the amplifier replica function is detected, the signal inputted to the amplifier replica function is changed such that the difference is reduced and the changed signal is outputted to the amplifier and therefore, with regard to the amplifier constituting the object of compensating for the distortion, the nonlinear distortion by the AM-AM conversion and the AM-PM conversion and the other distortion generated by being influenced by, for example, the distortion represented by the memory effect can effectively be compensated for.

DESCRIPTION OF PREFERRED EMBODIMENTS

Embodiments according to the invention will be explained in reference to the drawings.

(Embodiment 1)

A first embodiment of the invention will be explained.

Figure 1:
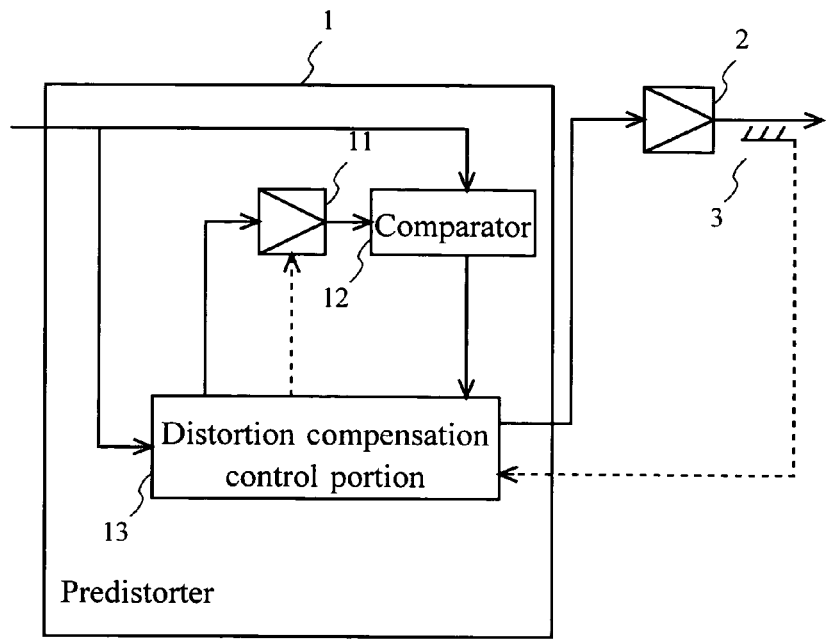
FIG. 1 is a diagram showing a constitution example of an amplifier apparatus having a predistorter according to a first embodiment of the invention.

FIG. 1 shows a constitution example of an amplifier apparatus having a predistorter to which the invention is applied.

An amplifier apparatus having a predistorter of the example is provided with a predistorter 1, an amplifier 2 and a directional coupler 3.

The predistorter 1 is provided with a replica of an amplifier (amplifier replica) 11, a comparator 12 and a distortion compensation control portion 13.

An example of operation executed by the amplifier apparatus having the predistorter of the example will be shown.

An input signal to the predistorter 1 is inputted to the distortion compensation control portion 13 and the comparator 12.

First, the distortion compensation control portion 13 inputs the input signal inputted to the predistorter 1 to the amplifier replica 11 as it is.

The amplifier replica 11 is provided with a characteristic similar to a nonlinearity of an AM-AM characteristic and an AM-PM characteristic of the amplifier 2 and is provided with a characteristic similar to a characteristic of a memory effect, further, a gain of the amplifier replica 11 is 1.0. The amplifier replica 11 changes a signal inputted from the distortion compensation control portion 13 by the characteristic provided to the amplifier replica 11 to output to the comparator 12.

The comparator 12 compares an input signal from the amplifier replica 11 with the input signal to the predistorter 1 and outputs information of an error vector of the two signals to the distortion compensation control portion 13.

The distortion compensation control portion 13 updates the input signal to the amplifier replica 11 such that the error vector is reduced by using an algorithm of reducing the error vector specified by the information inputted from the comparator 12.

Further, at the predistorter 1, a series of processings constituted by updating the input signal to the amplifier replica 11 by the algorithm by using the error vector and calculating the error vector by comparing an output signal from the amplifier replica 11 with the input signal to the predistorter 1 are executed repeatedly, thereby, the error vector is converged to nullify (0). Under the state, the distortion compensation control portion 13 outputs a signal the same as the input signal to be inputted to the amplifier replica 11 to the amplifier 2.

Here, since nonlinear characteristic of the amplifier replica 11 and a nonlinear characteristic of the amplifier 2 are equal to each other, when the input signal to the amplifier replica 11 in nullifying (0) the error vector is made to constitute the input signal of the amplifier 2 as it is, an output signal from the amplifier 2 becomes a signal in which a distortion has completely been compensated for.

Further, at the predistorter 1, it is necessary to calculate the algorithm by a plurality of times with respect to one sample of the input signal and therefore, for example, high-speed operation is executed.

Further, at the amplifier 2, a nonlinear characteristic is changed by a temperature change and an aging change and therefore, it is preferable to adaptively update also the characteristic of the amplifier replica 11. According to the example, the amplifier replica 11 is adaptively controlled.

Specifically, feedback is executed by acquiring a portion of the output signal from the amplifier 2 by, for example, the directional coupler 3 to input to the distortion compensation control portion 13. The distortion compensation control portion 13 detects a distortion included in a signal inputted from the amplifier 2 via the directional coupler 3 and updates the characteristic of the amplifier replica 11 such that the distortion is reduced (for example, minimized). With the regard to the updating processing, since the processing may follow a temperature change and an aging change and therefore, the processing may be, for example, a low-speed processing.

Further, according to the example, even when the characteristic of the amplifier replica 11 differs from the characteristic of the amplifier 2, the distortion compensation control portion 13 nullifies (0) the output (error vector) from the comparator 12 and therefore, all of the distortion included in a feedback signal inputted from the amplifier 2 via the directional coupler 3 can be regarded as an error of the amplifier replica 11.

Further, although according to the embodiment, a D/A (Digital to Analog) converter, an orthogonal modulator (or, orthogonal modulating portion), an up converter, a filter or the like are not shown, these may be provided pertinently. Further, presence of a feedback signal used with an object of adapting to an environmental change is not particularly restricted. Further, in order to use a feedback signal, a down converter, an oscillator, a filter, an orthogonal demodulator (or, orthogonal demodulating portion), an A/D (Analog to Digital) converter and the like may pertinently be provided. Further, in the distortion compensation control portion 13, in order to detect a distortion included in a feedback signal, the input signal to the predistorter can also be used.

Further, according to the amplifier apparatus having the predistorter of the example, for example, a complex signal comprising an I component and a Q component are dealt with and is processed by being subjected to complex operation.

Figure 8:
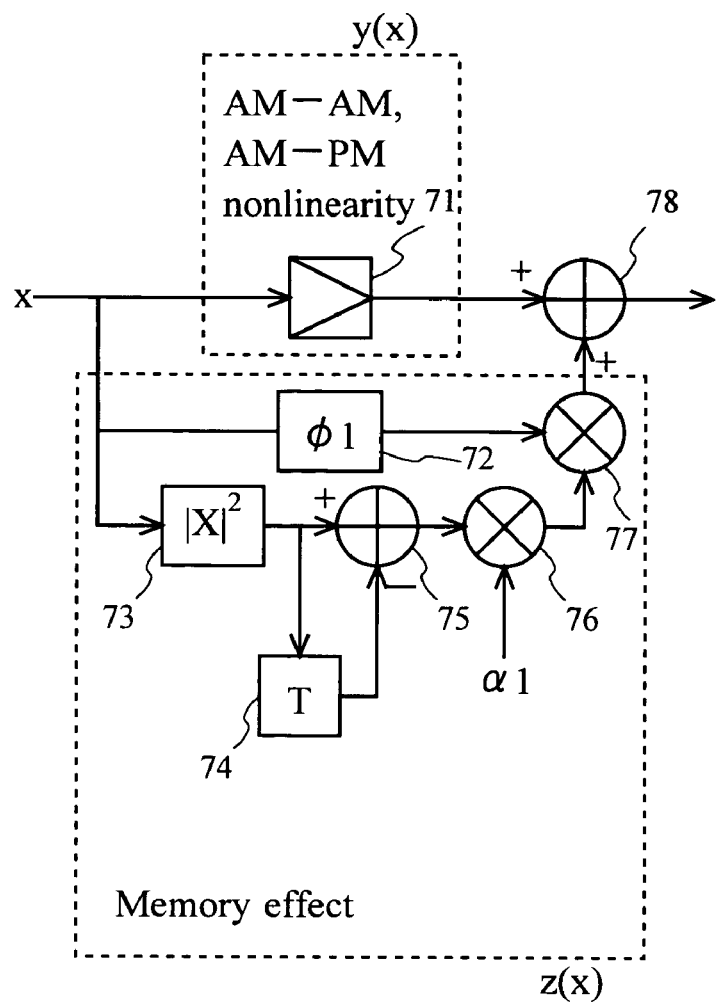
FIG. 8 is a diagram showing a constitution example of a model of an amplifying portion having a parallel constitution.
Figure 9:
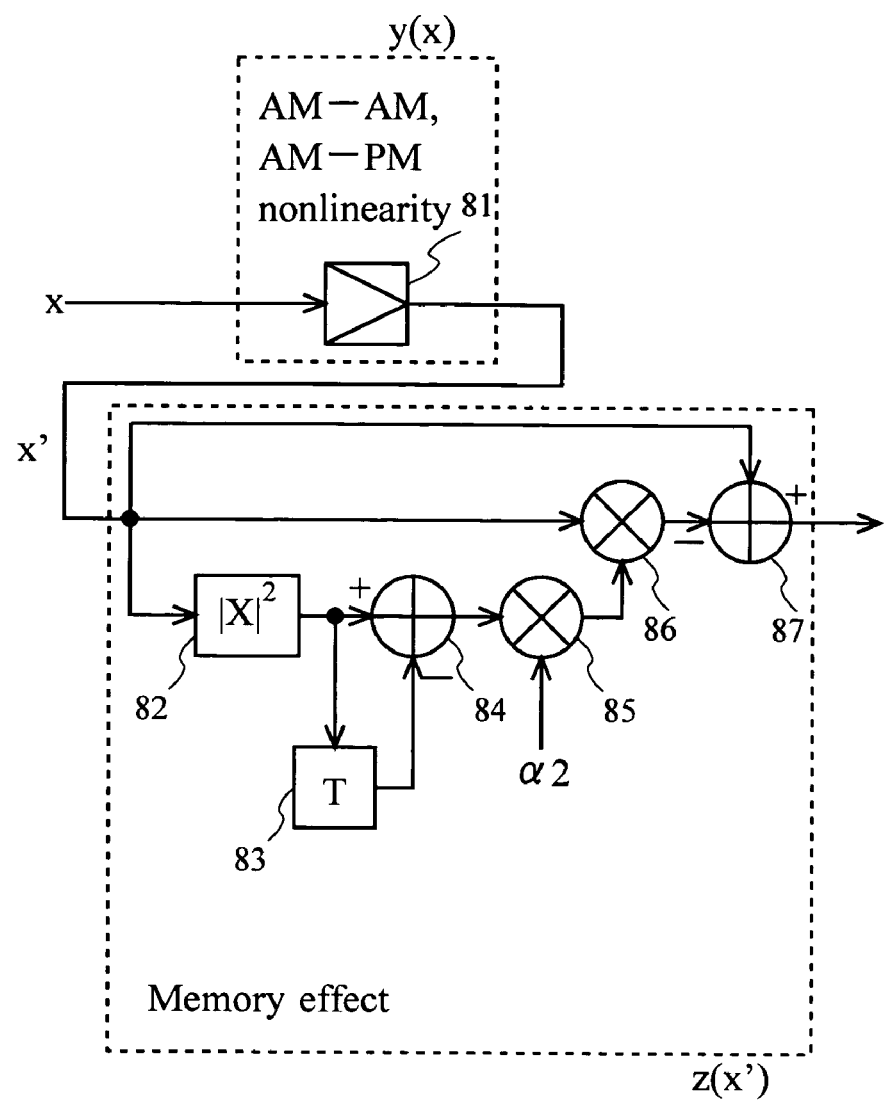
FIG. 9 is a diagram showing a constitution example of a model of an amplifying portion having a series constitution.

Further, various model constitutions of the amplifier 2 may be used, for example, a constitution shown in FIG. 8, a constitution shown in FIG. 9 and other constitution can be used.

As the amplifier replica 11, constitutions shown in FIG. 8, FIG. 9, FIG. 14, FIG. 15, and model constitutions of other various amplifiers can be used.

According to the example, the distortion compensation control portion 13 updates a parameter of the amplifier replica 11 such that the distortion included in the feedback signal from the amplifier 2 is reduced.

Here, normally, the larger the number of parameters of the amplifier replica 11, the more improved is the accuracy of approximating the amplifier 2. Generally, on a fine equivalence circuit of a devise level, a number of parameters is large, particularly, degrees of influence of parameters in the constitutions shown in FIG. 8 and FIG. 9 are predominant over the characteristic. As parameters in constitutions shown in FIG. 8 and FIG. 9, there are a phase change amount φ1 by a fixed phase changer 72, values α1, α2 multiplied by multipliers 76, 85, a time period T delayed by delay elements 74, 83 and values of tables of AM-AM characteristics and AM-PM characteristics provided to amplifying portions 71, 81. Further, an operational period of the delay element is one sample of an input signal to a predistorter and during one sample time period, a constant value (for example, value before one sample) is continued to be outputted.

The amplifying portions 71, 81 shown in FIG. 8, FIG. 9, FIG. 14, and FIG. 15 are provided with tables of AM-AM characteristics and tables of AM-PM characteristics. When an amplifying portion at inside of the amplifier replica 11 is provided with a table similar to those of the amplifying portions 71, 81 shown in FIG. 8, FIG. 9, FIG. 14, and FIG. 15, table values of the tables may be updated by various methods.

For example, with regard to a table value in correspondence with a value of power or amplitude of an input signal, by storing table values in correspondence with all of power values or amplitude values to a table to respectively update, or storing a table value in correspondence with a power value or an amplitude value constituting a representative point to a table to update as a representative value by a perturbation method or the like and interpolating the representative values by a linear line or interpolating by a curve by using root Nyquist interpolation or the like, a table value in correspondence with a power value or an amplitude value between the representative points can be determined. The table value provided by interpolation may be stored to the table or may not be stored. Further, various storing methods other than the perturbation method may be used and various interpolation methods other than the Nyquist interpolation method may be used.

As a specific example, by interpolating by a curve a plurality of points stored to a table in a plurality of partially overlapped sections and coupling respective curves provided by interpolating the curves, the points stored to the table can be updated. Further, in generating a table by learning by constituting portions of points in respective table points of the table storing an input power value or an input amplitude value and a distortion amount in correspondence with each other as representative points and interpolating other points based on the representative points, the table can be generated by coupling respective curves provided by interpolating curves in a plurality of different sections. As a point of coupling interpolation curves, for example, an inflection point of an amplifier can be used.

In this way, according to the predistorter 1 of the amplifier apparatus having the predistorter of the example, the amplifier replica 11 having the nonlinear characteristic the same as or approximated to that of the amplifier 2 constituting an object of compensating for a distortion is provided, the input signal to the amplifier replica 11 when the output from the amplifier replica 11 becomes equal to the input to the apparatus is calculated and the calculated signal is made to constitute the input signal to the amplifier 2.

Specifically, according to the predistorter 1 of the example, the amplifier replica 11 having the nonlinear characteristic the same as or approximated to that of the amplifier 2 constituting the object of compensating for the distortion amplifies a predetermined signal, the comparator 12 calculates the error vector between the output signal from the amplifier replica 11 and the input signal to the predistorter 1, further, and the distortion compensation control portion 13 updates the input signal (the predetermined signal) to the amplifier replica 11 such that, for example, the error vector calculated by the comparator 12 is minimized and the input signal to the amplifier replica 11 converged or updated by a predetermined plurality of times is made to constitute the input signal to the amplifier 2.

Further, according to the predistorter 1 of the example, the distortion compensation control portion 13 adaptively updates the nonlinear characteristic of the amplifier replica 11 in accordance with the nonlinear characteristic of the amplifier 2.

For example, according to the predistorter 1 of the example, in a constitution including the replica 11 of the amplifier 2, a control loop for making the characteristic of the amplifier replica 11 coincide with the characteristic of the amplifier 2 and a function of calculating a predistortion for, for example, minimizing the distortion of the output signal from the amplifier replica 11 in correspondence with the input signal to the predistorter 1 for providing the predistortion to the amplifier 2, in the amplifier replica 11, the nonlinear characteristic of the AM-AM characteristic and the AM-PM characteristic and the characteristic by generating the memory effect can be learned, further, other parameter can be updated.

As described above, according to the example, in the predistorter 1 in which by providing the predistortion to the signal inputted to a distortion block (amplifier 2 in this example), the distortion generated in the distortion block is compensated for, there are provided a replica function (amplifier replica 11 in this example) for reproducing an input/output characteristic (transfer function) similar to that of the distortion block, a comparing function (comparator 12 in this example) for outputting a difference between the input signal to the predistorter 1 and the output signal from the replica function, and a calculating function (distortion compensation control portion 13 in this example) for calculating a predistortion signal provided to the replica function by constituting a target of reducing the output from the comparing function, and a predistortion signal calculated by the calculating function is provided to the distortion block.

Further, according to the example, in the above-described predistorter 1, there are provided at least a distortion detecting function (distortion compensation control portion 13 in this example) for detecting the distortion generated at the distortion block by inputting the output signal from the distortion block and a control function (distortion compensation control portion 13 in this example) for updating a variable parameter provided to the replica function to reduce the distortion detected by the distortion detecting function, the calculating function executes a first processing of setting an initial value of the predistortion signal, a second processing of providing the predistortion signal to the replica function and receiving the output from the comparing function, and a third processing of updating the predistortion signal to reduce the output from the comparing function at each sample period of digital input signal to the predistorter 1 to provide the predistortion signal provided by repeatedly executing the second processing and third processing the distortion block to the distortion block.

Therefore, according to the predistorter 1 of the amplifier apparatus having the predistorter of the example, by a distortion compensating system using the replica 11 of the amplifier 2, the nonlinear distortion by the AM-AM characteristic and AM-PM characteristic, the distortion generated by the memory effect and other distortion can be compensated for completely or with high accuracy to reduce.

As an example, at a transmitting portion of a base station apparatus of a mobile communication system, by compensating for a distortion generated at a power amplifier by a digital predistortion (DPD) system by the predistorter 1 of the example, in addition to the nonlinear distortion by the AM-AM characteristic and the AM-PM characteristic, also the influence of the memory effect can effectively be compensated for.

Further, according to the predistorter 1 of the example, amplifier replica means is constituted by the function of amplifier replica 11, difference detecting means is constituted by the function of the comparator 12 and amplifier replica input signal changing means and change signal outputting means are constituted by the function of the distortion compensation control portion 13.

Further, according to the predistorter 1 of the example, distortion detecting means is constituted by the function of the directional coupler 3 and the function of the distortion compensation control portion 13 and amplifier replica parameter updating means is constituted by the function of the distortion compensation control portion 13.

Further, according to the example, an amplifier constituting an object of compensating for a distortion is constituted by the amplifier 2.

(Embodiment 2)

A second embodiment of the invention will be explained.

Figure 2:
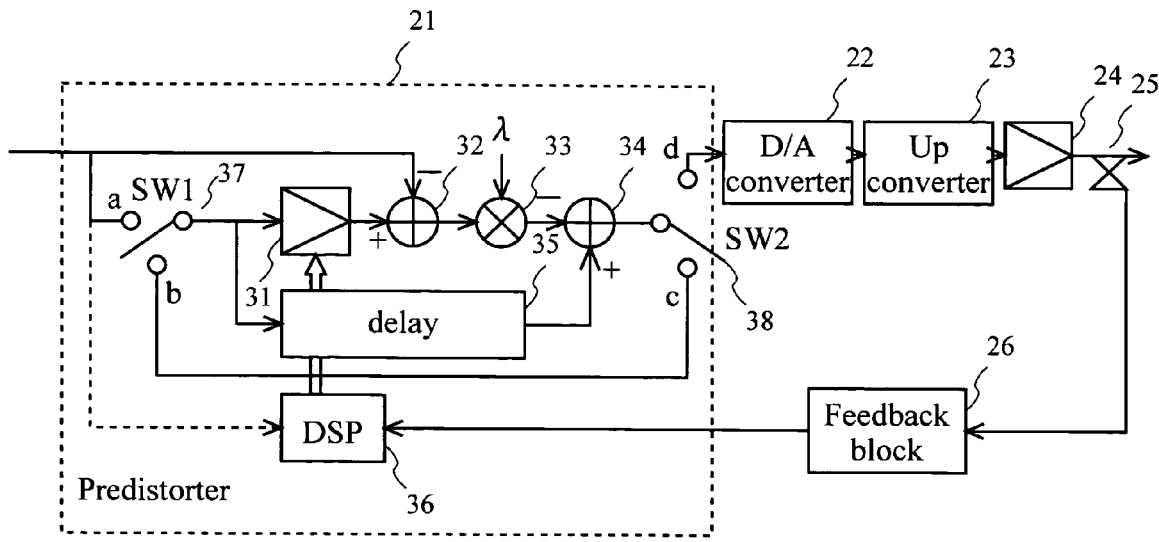
FIG. 2 is a diagram showing a constitution example of an amplifier apparatus having a predistorter according to a second embodiment of the invention.

FIG. 2 shows a constitution example of an amplifier apparatus having a predistorter of the example.

The amplifier apparatus having the predistorter of the example is provided with a predistorter 21, a D/A converter 22, an up converter 23, an amplifier 24, a directional coupler 25, and a feedback portion (feedback block) 26.

The predistorter 21 is provided with a replica of an amplifier (amplifier replica) 31, a first adder 32, a multiplier 33, a second adder 34, a delay portion 35, a digital signal processor (DSP) 36, a first switch (SW1) 37 and a second switch (SW2) 38. Further, as the multiplier 33, for example, a complex multiplier is used.

An example of operation executed by the amplifier apparatus having the predistorter of the example will be shown.

First, by connecting the first switch 37 to an input side ("a" side) of the predistoter 21, an input signal to the predistorter 21 is inputted to the amplifier replica 31 and the delay portion 35. Further, the input signal to the predistorter 21 is inputted to the first adder 32. Further, the input signal to the predistoter 21 is a digital signal.

The amplifier replica 31 is provided with a nonlinear characteristic the same as a nonlinear characteristic provided to the amplifier 24, that is, provided with a characteristic similar to the nonlinear characteristic of an AM-AM characteristic and an AM-PM characteristic of the amplifier 24 and is provided with a characteristic similar to a characteristic of a memory effect. Further, a gain of the amplifier replica 31 is 1.0. The amplifier replica 31 changes the signal inputted via the first switch 37 by the characteristic provided to the amplifier replica 31 to output to the first adder 32.

The first adder 32 subtracts the input signal to the predistoter 21 from a signal inputted from the amplifier replica 31 and outputs a signal in correspondence with an error vector of the two signals calculated thereby to the multiplier 33. Further, the first adder 32 is provided with a roll similar to, for example, that of the comparator 12 of the predistorter 1 shown in FIG. 1.

The multiplier 33 multiplies a signal of the error vector inputted from the first adder 32 by a predetermined value λ and outputs a signal of a result of the multiplication to the second adder 34. Here, as a predetermined value λ, for example, as a coefficient used in a general LMS algorithm, a value equal to or smaller than 1.0 is used.

The delay portion 35 delays the signal inputted via the first switch 37 by a predetermined time period to output to the second adder 34. Here, as a predetermined time period (delay time period) at the delay portion 35, there is set a time period of matching a timing with a signal passing a signal path having the amplifier replica 31, the first adder 32, the multiplier 33 and the second adder 34.

The second adder 34 subtracts a signal (signal of the error vector multiplied by the coefficient λ) inputted from the multiplier 33 from the signal inputted from the delay portion 35 and outputs a signal of a result of the subtraction to the second switch 38. First, the second switch 38 is switched to connect to a feedback side ("c" side), next, the first switch 37 is switched to connect to the feedback side ("b" side), thereby, an output signal from the second adder 34 is fed back to input to the amplifier replica 31 and the delay portion 35 and the input signals of the amplifier replica 31 and the delay portion 35 are updated.

When the processing of a feedback loop is executed repeatedly by a plurality of times, a signal (signal of the error vector multiplied by the coefficient λ) outputted from the multiplier 33 is nullified (0), and at this occasion, the second switch 38 is switched to connect to an output side ("d" side) of the predistorter 21. Then, a signal outputted from the second adder 34 is inputted to the D/A converter 22 via the second switch 38.

The D/A converter 22 converts the signal inputted via the second switch 38 from a digital signal to an analog signal to output to the up converter 23.

The up converter 23 converts a frequency of the signal inputted from the D/A converter 22 to a signal of a radio frequency (RF) to output to the amplifier 24.

The amplifier 24 amplifies the signal inputted from the up converter 23 to output. Here, since the error vector with regard to the output signal from the amplifier replica 31 is nullified (0) as described above, an output signal from the amplifier 24 becomes a signal without distortion, which is amplified by compensating for the distortion.

Further, learning is executed with regard to a characteristic (parameter) of the amplifier replica 31.

The directional coupler 25 distributes a portion of the output signal from the amplifier 24 to output to the feedback block 26.

The feedback block 26 is provided with a down converting function and an A/D converting function or the like, executes a pertinent processing of a down converting processing or an A/D converting processing with regard to the signal inputted from the directional coupler 25 and thereafter outputs the signal after the processing to DSP 36 for controlling to compensate for the distortion.

DSP 36 detects the distortion included in the signal inputted from the amplifier 24 via the directional coupler 25 and the feedback block 26 and adaptively updates the characteristic of the amplifier replica 31 to reduce, (for example, minimize) the distortion.

Here, DSP 36 can also use the input signal to the predistorter 21 in order to detect the distortion included in the feedback signal.

Further, according to the amplifier apparatus having the predistorter of the example, for example, a complex signal comprising an I component and a Q component is dealt with and subjected to complex operation to process.

Further, although according to the example, there is shown a case of using the algorithm of LMS, various algorithms may be used.

Further, according to the predistorter 21 of the example, there are present a loop (predistortion loop) for generating a predistortion by LMS or the like and a loop (amplifier replica loop) for making the characteristic of the amplifier replica 31 coincide with the characteristic of the amplifier 24 constituting an object of compensating for the distortion, and the predistortion loop is converged at each sampling regardless of approximating accuracy of the amplifier replica 31. That is, an input signal for, for example, minimizing the distortion is always calculated for the current amplifier replica 31, further, when approximation of the amplifier replica 31 is poor, the distortion of the output from the amplifier 24 remains by that amount. Further, the amplifier replica loop is operated, for example, to minimize the distortion. A speed of updating the amplifier replica 31 may be normally retarded considerably in comparison with that of the predistortion loop, for example, may be at a degree of capable of catching up a variation in temperature of the amplifier 24.

Further, according to LMS of the example, LMS is converged again from the start at each time of changing the input signal to the predistorter 21 (each sampling), for example, by constituting the value of the step size parameter $\lambda$ by a complex number to be made to be variable in accordance with the input to the predistoter 21, an operational amount can be reduced.

Further, as a parameter of the amplifier replica 31 optimized by DSP 36, various parameters may be used, for example, when the model constitutions as shown by FIG. 8 and FIG. 9 are used, one or more of the phase change amount $\phi 1$ by the fixed phase changer 72, the values $\alpha 1$, $\alpha 2$ multiplied by the multipliers 76, 85, the time period T delayed by the delay elements 74, 83, the table values (may be only representative points) of the AM-AM characteristic and the AM-PM characteristic provided to the amplifying portions 71, 81 may be used.

As described above, according to the example, in the predistorter 21 for compensating for the distortion generated in the distortion block by providing the predistortion to the signal inputted to the distortion block (amplifier 24 in this example), there are provided a replica function (amplifier replica 31 in this example) for reproducing an input/output characteristic (transfer function) similar to that of the distortion block, a comparing function (first adder 32 in this example) for outputting a difference between the input signal to the predistorter 21 and the output signal from the replica function, and the feedback loop for updating the predistortion signal provided to the replica function by constituting a target of reducing the output from the comparing function and the predistortion signal provided thereby is provided to the distortion block.

Further, according to the example, in the above-described predistorter 21, there are provided at least a distortion detecting function (DSP 36 in this example) for detecting the distortion generated at the distortion block by inputting the output signal from the distortion block, and a control function (DSP 36 in this example) for updating the variable parameter provided to the replica function to reduce the distortion detected by the distortion detecting function, the feedback loop executes a first processing of setting an initial value of the predistortion signal, a second processing of acquiring the output from the comparing function by providing the predistortion signal to the replica function and a third processing of updating the predistortion signal to reduce the output from the comparing function at each sampling period of the digital input signal to the predistorter 21 and the distortion signal provided by repeatedly executing the second processing and third processing is provided to the distortion block.

Therefore, according to the predistorter 21 of the amplifier apparatus having the predistorter of the example, by the distortion compensating system using the replica 31 of the amplifier 24, the nonlinear distortion by the AM-AM characteristic and the AM-PM characteristic the distortion generated by the memory effect and other distortion can be compensated for completely or with high accuracy to reduce.

As an example, at a transmitting portion of a base station apparatus of a mobile communication system, by compensating for a distortion generated at a power amplifier by a digital predistortion (DPD) system by the predistorter 21 of the example, in addition to the nonlinear distortion by the AM-AM characteristic and the AM-PM characteristic, a distortion generated by being influenced by, for example, what is represented by the memory effect other than the above-described nonlinear distortion can effectively be compensated for.

Further, according to the predistorter 21 of the example, amplifier replica means is constituted by the function of the amplifier replica 31, difference detecting means is constituted by the function of the first adder 32, amplifier replica input signal changing means and change signal outputting means are constituted by a function of the multiplier 33, a function of the second adder 34, a function of the delay portion 35 and functions of the switches 37, 38.

Further, according to the predistorter 21 of the example, distortion detecting means is constituted by a function of the directional coupler 25, a function of the feedback block 26 and a function of DSP 36, and amplifier replica parameter updating means is constituted by a function of DSP 36.

Further, according to the example, an amplifier constituting an object of compensating for the distortion is constituted by the amplifier 24.

(Embodiment 3)

A third embodiment of the invention will be explained.

Figure 3:
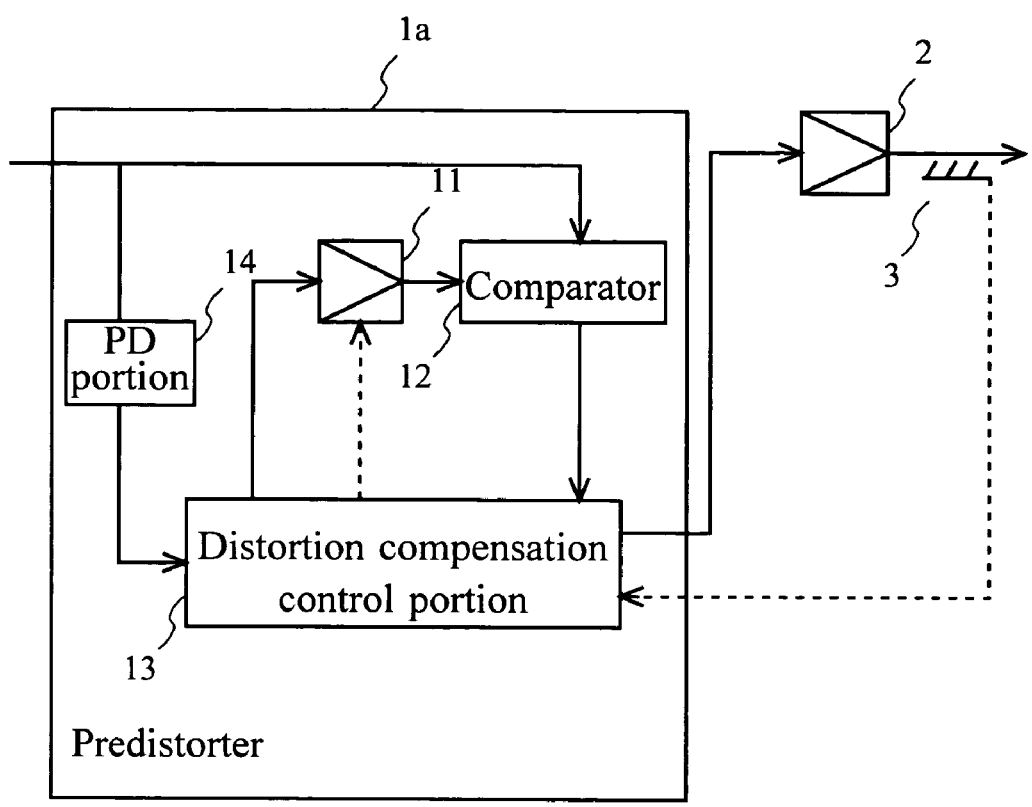
FIG. 3 is a diagram showing a constitution example of an amplifier apparatus having a predistorter according to a third embodiment of the invention.

FIG. 3 shows a constitution example of an amplifier apparatus having a predistorter of the example.

An amplifier apparatus having a predistorter of the example is provided with a constitution similar to the constitution shown in FIG. 1 except that a predistortion portion (PD portion) 14 is provided between an input end of a predistorter 1a and the distortion compensation control portion 13. Further, in FIG. 3, constitution portions 2, 3, 11 through 13 similar to those shown in FIG. 1 are shown by using the same notations.

As an example of operation executed by the predistorter 1a of the amplifier apparatus having the predistorter of the example, a portion different from that shown in FIG. 1 will be explained.

That is, according to the example, a signal inputted from the input end of the predistorter 1a (input signal to the predistorter 1a) is inputted to the comparator 12 and is inputted to the predistortion portion 14, and a signal, for example, compensating for a distortion by a predistortion system roughly by the predistortion portion 14 is inputted to the distortion compensation control portion 13. At the distortion compensation control portion 13, the signal inputted from the predistortion portion 14 is outputted as it is as an initial signal provided to the amplifier replica 11.

Therefore, according to the predistorter 1a of the example, by using a result of predistortion of the input signal as an initial value of a loop (predistortion loop) with regard to the amplifier replica 11 by using the predistortion portion 14 constituted by a predistorter having, for example, a table with rough accuracy, a number of times of repeating a processing of the loop can be reduced. For example, even in the case of executing again a converging processing from the start at each time of changing the input signal to the predistorter 1a (each sampling), the conversion can be executed swiftly.

Further, according to the example, subpredistorter means is constituted by the function of the predistortion portion 14.

(Embodiment 4)

A fourth embodiment of the invention will be explained.

Figure 4:
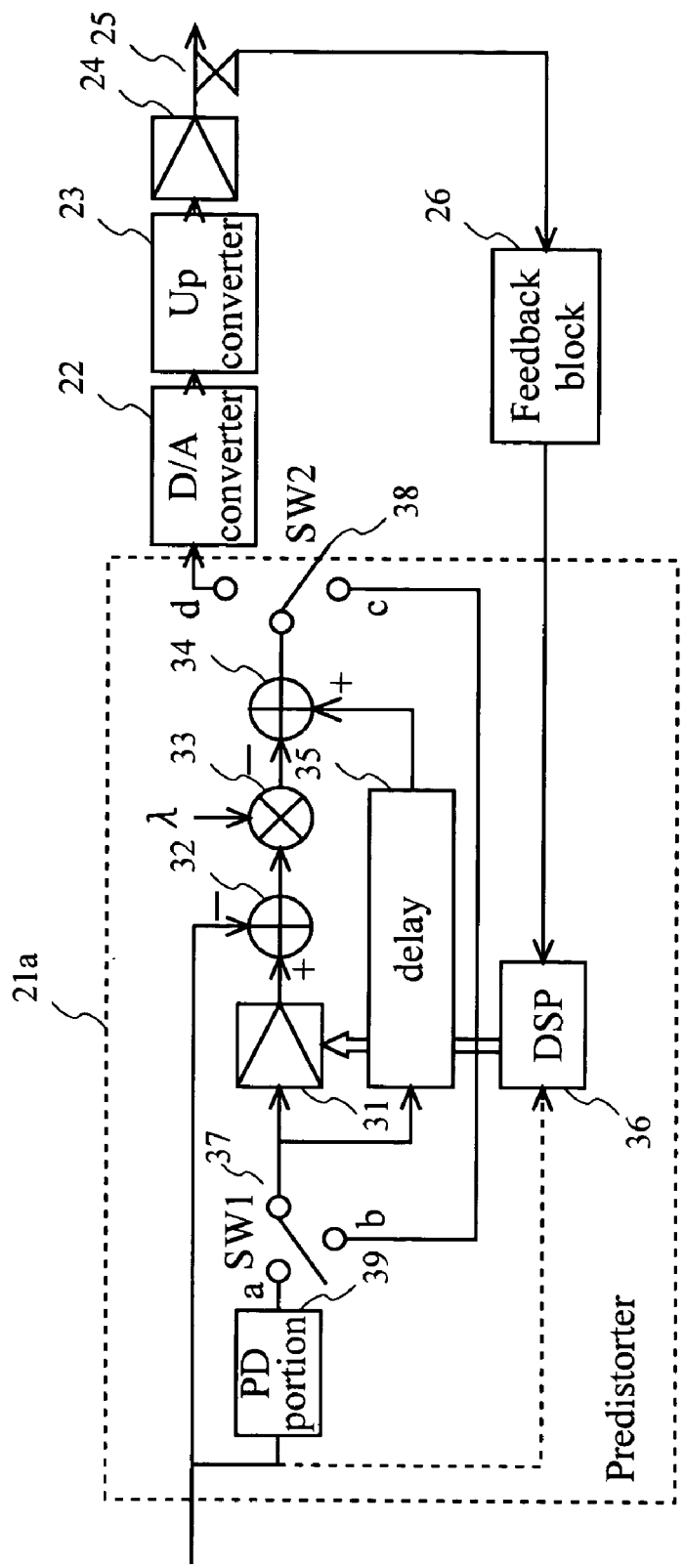
FIG. 4 is a diagram showing a constitution example of an amplifier apparatus having a predistorter according to a fourth embodiment of the invention.

FIG. 4 shows a constitution example of an amplifier apparatus having a predistorter of the example.

An amplifier apparatus having a predistorter of the example is provided with a constitution similar to the constitution shown in FIG. 2 except that a predistortion portion (PD portion) 39 is provided between an input end of a predistorter 21a and the first switch 37. Further, in FIG. 4, constitution portions 22 through 26, 31 through 38 similar to those of FIG. 2 are shown by using the same notations.

As an example of operation executed by the predistorter 21a of the amplifier apparatus having the predisorter of the example, a portion different from that shown in FIG. 2 will be explained.

That is, according to the example, a signal (input signal to the predistorter 21a) inputted from the input end of the predistorter 21a is inputted to the first adder 32 and is inputted to the predistortion portion 39, and a signal, for example, compensating for a distortion by a predistortion system roughly by the predistortion portion 39 is inputted to the amplifier replica 31 and the delay portion 35 via the first switch 37.

Therefore, according to the predistorter 21a of the example, by providing the predistortion processing 39 constituted by, for example, the predistorter having a table with rough accuracy at a prestage of LMS processing and using a result of predistortion of the input signal as an initial value of a loop (predistortion loop) with regard to the amplifier replica 31, a number of times of repeating the processing at the loop can be reduced. For example, even when the LMS processing is converged again from the start at each time of changing the input signal to the predistorter 21a (at each sampling), the conversion can be executed swiftly.

Further, according to the example, subpredistorter means is constituted by the function of the predistortion portion 39.

(Embodiment 5)

A fifth embodiment of the invention will be explained.

Figure 5:
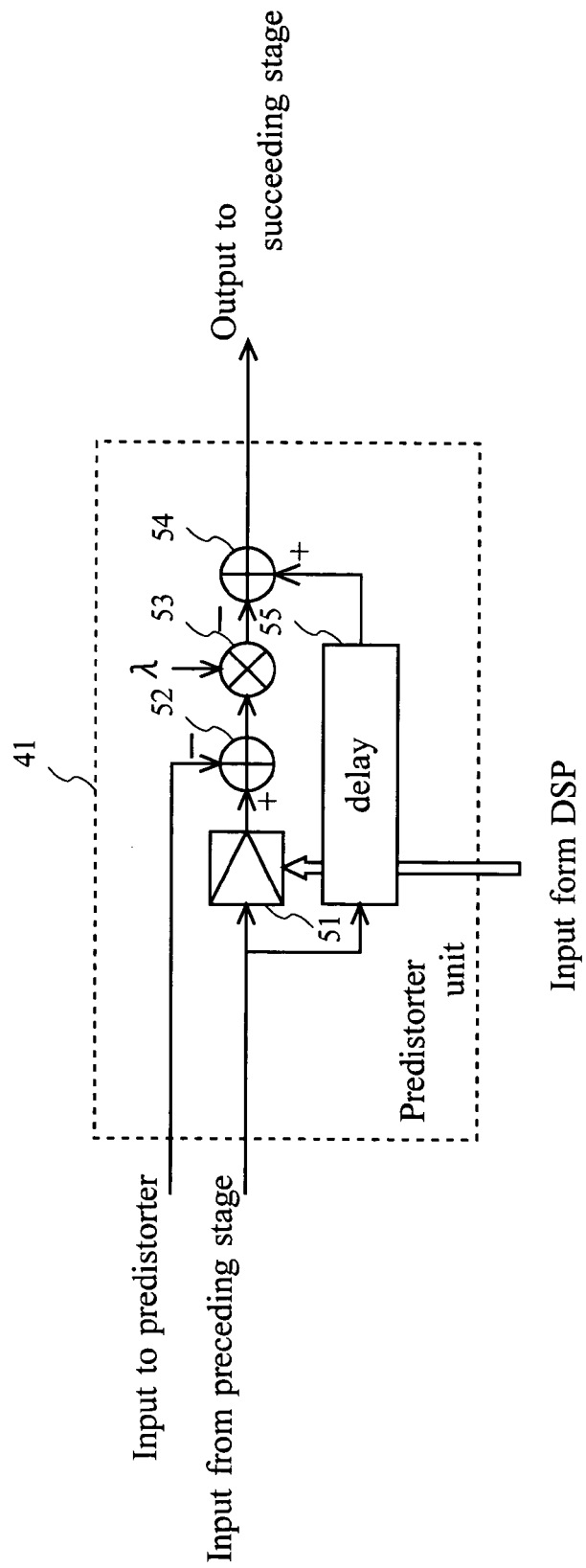
FIG. 5 is a diagram showing a constitution example of an amplifier apparatus having a predistorter according to a fifth embodiment of the invention.

FIG. 5 shows a constitution example of a predistorter unit 41 constituting a predistorter of the example.

The predistorter of the example is constituted by connecting a plurality (n pieces in this example) of predistorter units having a constitution similar to that of the predistorter unit 41 shown in FIG. 5 in series.

The predistorter unit at a first stage inputs an input signal to the predistorter of the example and outputs a signal of a result of processing the signal to a second stage of the predistorter unit.

The predistorter unit of an i-th stage (i=2, 3, . . . , (n−1)) inputs an output signal from a preceding stage ((i−1)-th stage) of the predistorter unit and outputs a signal of a result of processing the signal to a succeeding stage ((i+1)-th stage) of the predistorter unit.

A n-th stage of the predistorter unit inputs an output signal from a (n−1)th stage of the predistorter unit and outputs a signal of a result of processing the signal to a side of an amplifier constituting an object of compensating for a distortion.

Further, also with regard to the respective predisorter units at the second stage and thereafter, the input signal to the predistorter of the example is inputted thereto and used for processings.

Whereas the predistorter 21 shown in FIG. 2 and the predistorter 21a shown in FIG. 4 form predistortion loops and repeatedly process signals, the predistorter of the example generally achieves a similar effect by successively processing signals by a plurality of the predistorter units 41 connected in series.

The predistorter unit 41 of the example is provided with an amplifier replica 51, a first adder 42, a multiplier 53, a second adder 54 and a delay portion 55. Further, as the multiplier 53, for example, a complex multiplier is used.

The first adder 52 is inputted with the input signal to the predistorter of the example, the amplifier replica 51 and the delay portion 55 are inputted with an output signal from the predistorter of the preceding stage which is the preceding stage, or an initial stage of the predistorter unit is inputted with the input signal to the predistorter of the example, further, an output signal from the second adder 54 is outputted to the predistorter unit of a succeeding stage which is the succeeding stage, or an output signal of a final stage of the predistorter unit is outputted to a side of an amplifier (for example, D/A converter similar to that shown in FIG. 2).

Here, as the input signal to the predistorter of the example, an input signal of a sample constituting an object of compensation currently is used and a timing is adjusted as necessary.

Further, at the amplifier replica 51, the first adder 52, the multiplier 53, the second adder 54 and the delay portion 55, for example, processings similar to the processings executed by the corresponding processing portions 31 through 35 provided to the predistorter 21 shown in FIG. 2 are executed.

Further, the example is provided with DSP common to the plurality of predistorter units. Further, the DSP outputs a control signal for adaptively updating characteristics of amplifier replicas to the amplifier replicas of the respective predistorter units based on an output signal from an amplifier constituting an object of compensating for the distortion to update the characteristics.

Further, according to the predistorter of the example, for example, a complex signal comprising an I component and a Q component is dealt with and processed by being subjected to complex operation.

As described above, the predistorter of the example is formed by a multiple stages by providing the plurality of predistorter units each having a constituent portion for acquiring a difference between an output signal from the amplifier replica 51 and the input signal to the corresponding predistorter.

According to each of the predistorter units, the amplifier replica 51 having a nonlinear characteristic the same as or approximated to that of the amplifier constituting the object of compensating for a distortion amplifies the input signal, the first adder 52 calculates an error vector of the output signal from the amplifier replica 51 and the input signal to the predistorter, the adder 53 multiplies the error vector by the predetermined value λ and the second adder 54 subtracts a result of multiplication by the multiplier 53 from an input signal from the delay portion 55 to output.

Further, by continuously executing such processings by the plurality of predistorter units, the input signal to the amplifier replica is updated to, for example, minimize the error vector and a signal converged or updated by a plurality of predetermined times is made to constitute the input signal to the amplifier constituting the object of compensating for a distortion.

Further, the nonlinear characteristic of the amplifier replica of each predistorter unit is adaptively updated in accordance with the nonlinear characteristic of the amplifier constituting the object of compensating for a distortion.

Further, a constitution example of the predistorter will be shown. The constitution example is provided with a subpredistorter function corresponding to those of the predistortion portions 14, 39 shown in FIG. 3 and FIG. 4.

In a predistorter for inputting a digital IQ signal of a base band or an intermediate frequency (IF) and providing a predistortion for compensating for a distortion generated at an amplifier for transmitting a radio wave to output to the amplifier, the following functions are provided.

That is, there are provided a replica function (amplifier replica 51 in this example) having a memory (delay) function for reproducing a memory effect of the amplifier and a distortion table for reproducing the nonlinearity of the amplifier to reproduce such that a mean gain of an input/output characteristic (transfer function) of the amplifier becomes about zero (0) decibel, a comparing function (first adder 52 in this example) for outputting the error vector of the input signal to the predistorter and the output signal from the replica function, a subpredistorter function for providing an initial value of the predistortion signal at each sampling period of the input signal to the predistorter, and a calculating function (multiplier 53, second adder 54, delay portion 55 in this example) for calculating a predistortion signal for reducing the error vector based on a current output from the replica function to output as an input signal to a succeeding replica function.

Further, there are provided a distortion detecting function for detecting a distortion generated at the amplifier from a signal constituted by subjecting the predistortion signal calculated by the calculating function to D/A conversion to an RF frequency by converting a frequency thereof and amplified by the amplifier, and a control function (DSP in this example) for updating a variable parameter provided to the replica function to reduce (for example, minimize) the distortion.

Further, a plurality of pieces of distortion compensating blocks (predistorter unit 41 in this example) constituting a single unit by a set of the replica function, the comparing function and the calculating function are provided and connected in series, and an output from the subpredistorter function is provided as an initial value of an initial stage of the distortion compensating block, and respectives of the distortion compensating blocks are constituted by a plurality of pieces of corresponding hardwares to execute pipeline operation.

Therefore, according to the predistorter of the example, by forming algorithm processings for, for example, minimizing the error of the output from the amplifier replica 51 and the input to the predistorter by a multiple of stages to execute, for example, the nonlinear distortion of the AM-AM characteristic and the AM-PM characteristic, the distortion generated by the memory effect and other distortion can be compensated for to reduce completely or with high accuracy without executing a high-speed calculation.

Further, for example, by using a result of a predistortion of the input signal to the predistorter as an initial value of the input at the initial stage by using the predistortion function having rough accuracy, a number of the multiple of stages (number of multiple of stages of predistorter units) can be reduced.

Further, according to the example, the distortion compensating unit is constituted by the predistorter unit 41.

Further, according to the predistorter unit 41 of the example, amplifier replica means is constituted by a function of the amplifier replica 51, difference detecting means is constituted by a function of the first adder 52, amplifier replica input signal changing means is constituted by a function of the multiplier 53, a function of the second adder 54 and a function of the delay portion 55. Further, according to the example, change signal outputting means is constituted by a function of the second adder of a final stage of the predisotrer unit.

Further, according to the predistorter of the example, distortion detecting means is constituted by a function of a directional coupler, a function of a feedback block and a function of DSP having functions similar to those shown in, for example, FIG. 2, and amplifier replica parameter updating means is constituted by a function of the DSP.

Further, according to the predistorter of the example, subpredistorter means is constituted by a function of a predistortion portion having a function similar to that shown in, for example, FIG. 4 and provided to the predistorter unit of the initial stage.

Further, according to the example, the amplifier constituting the object of compensating for a distortion is provided at a post-stage of the final stage of predistorter unit.

(Embodiment 6)

A sixth embodiment of the invention will be explained.

Figure 13:
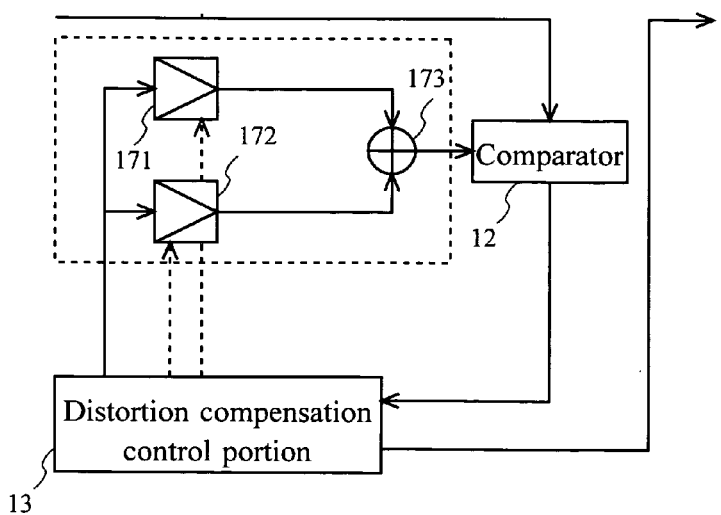
FIG. 13 is a diagram showing a constitution example of a predistorter according to a sixth embodiment of the invention.

FIG. 13 shows a constitution example for a Doherty amplifier of a predistorter of the invention. Specifically, FIG. 13 shows a replica 171 for a carrier amplifier, a replica 172 for a peak amplifier, an adder 173 for adding outputs of the replicas 171, 172 and outputting a result of the addition to a comparator 12 and a distortion compensation control portion 13.

The Doherty amplifier realizes a high efficiency by using the carrier amplifier for amplifying a large portion of a signal when an output power is low and the peak amplifier normally operated by a low power consumption equal to or lower than C class to increase a saturated point of the carrier amplifier by amplifying a signal mainly when the output power is high. In accordance therewith, also the example is constituted to be provided with the two amplifiers.

The distortion compensation control portion 13 is similar to that of the case shown in, for example, FIG. 1 except that the two replicas (replica 171 for carrier amplifier, replica 172 for peak amplifier) are adaptively updated and processings are carried out for the two replicas. From other point of view, when a dotted line portion shown in FIG. 13 is regarded as a single amplifier (Doherty amplifier), the constitution is equal to the constitution of FIG. 1. The embodiment is not limited to the constitution of the replicas for the Doherty amplifier but, for example, the constitution of FIG. 1 may be used.

Figure 14:
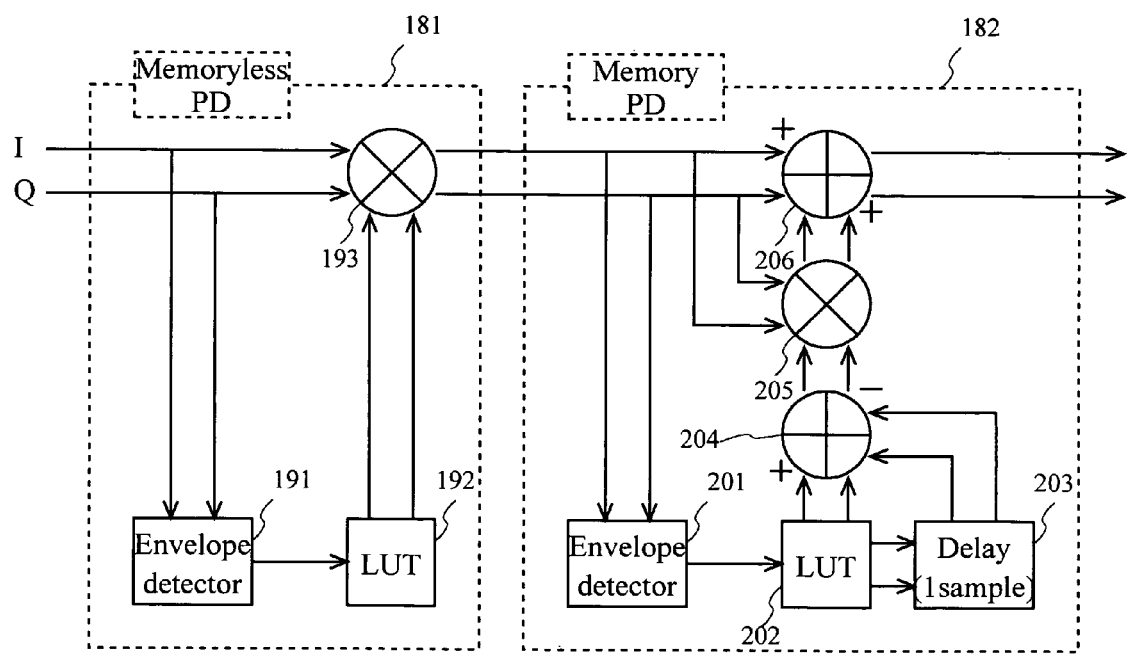
FIG. 14 is a diagram showing other constitution example of a model of an amplifying portion.

FIG. 14 shows other constitution example of a model of an amplifying portion.

The model of the example is constituted by a memoryless predistorter (memoless PD) 181 and a memory predistorter (memory PD) 182.

The memoless PD 181 is provided with an envelope detector 191, a distortion compensating table 192 comprising a look up table (LUT) constituted by using a memory and a complex multiplier 193.

The memory PD 182 is provided with an envelope detector 201, a distortion compensating table 202 comprising a look up table (LUT) constituted by using a memory, a delay portion 203 of an amount of one sample, an adder 204, a complex multiplier 205 and an adder 206.

According to the memoless PD 181, the envelop detector 191 detects an amplitude (or power) of an input signal to the model of the example, the distortion compensating table 192 outputs a distortion compensating coefficient comprising a complex vector in correspondence with a result of the detection, and the complex multiplier 193 subjects the input signal to the model of the example and the distortion compensating coefficient to complex multiplication and outputs a result thereof to the memory PD 182. Here, the distortion compensating table 192 is stored with a corresponding relationship between a detected value by the envelope detector 191 and the distortion compensating coefficient.

According to the memory PD 182, an output signal from the complex multiplier 193 of the memoless PD 181 is inputted, the envelope detector 201 detects an amplitude (power) of the input signal, the distortion compensating table 202 outputs a distortion compensating coefficient comprising a complex vector in correspondence with a result of the detection, the delay portion 203 delays the distortion compensating coefficient by an amount of a single sample time period, the adder 204 subtracts the distortion compensating coefficient from the delay portion 203 from the distortion compensating coefficient from the distortion compensating table 202, the complex multiplier 205 subjects the input signal from the memoless PD 181 and a result of the subtraction to complex multiplication, and the adder 206 adds the input signal from the memoless PD 181 and a result of the complex multiplication. A signal of a result of the addition is outputted from the model of the example. Here, the distortion compensating table 202 is stored with a corresponding relationship between a detected value by the envelope detector 201 and the distortion compensating coefficient.

Figure 15:
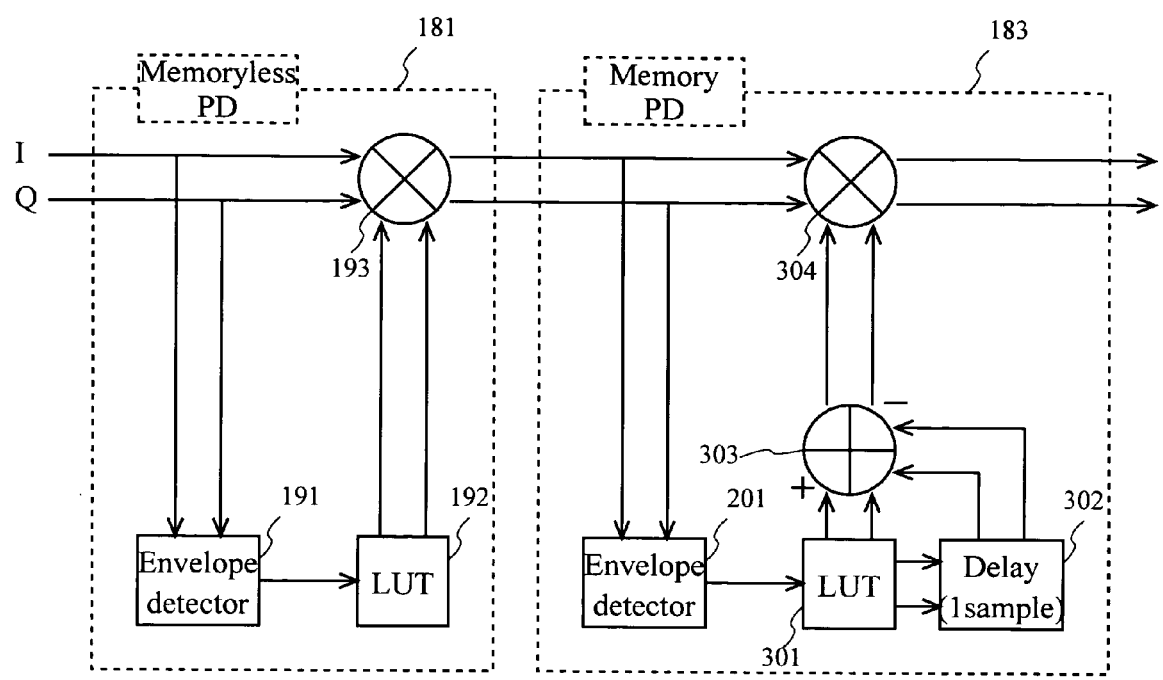
FIG. 15 is a diagram showing other constitution example of a model of an amplifying portion.

FIG. 15 shows other constitution example of a model of an amplifying portion.

The model of the example is constituted by a memoryless predistorter (memoless PD) 181 and a memory predistorter (memory PD) 183.

Here, constitution and operation of the memoless PD 181 are similar to those shown in, for example, FIG. 14.

The memory PD 183 is provided with an envelope detector 201, a distortion compensating table 301 comprising a look up table (LUT) constituted by using a memory, a delay portion 302 of an amount of one sample, an adder 303, and a complex multiplier 304.

According to the memory PD 183, an output signal from the complex multiplier 193 of the memoless PD 181 is inputted, the envelope detector 201 detects an amplitude (or power) of the input signal, the distortion compensating table 301 outputs a distortion compensating coefficient comprising a complex vector in correspondence with a result of the detection, the delay portion 302 delays the distortion compensating coefficient by an amount of a single sample time period, the adder 303 subtracts the distortion compensating coefficient from the delay portion 302 from the distortion compensating coefficient from the distortion compensating table 301, and the complex multiplier 304 subjects the input signal from the memoless PD 181 and a result of the subtraction to complex multiplication. A signal of a result of the complex multiplication is outputted from the model of the example. Here, the distortion compensating table 301 is stored with a corresponding relationship between a detected value by the envelope detector 201 and the distortion compensating coefficient.

A background of a technology according to the invention will be shown as follows. Further, all of items described here are not necessarily limited as a background art.

For example, according to a base station apparatus provided for a mobile communication system adopting W-CDMA (Wide-band Code Division Multiple Access) system as a mobile communication system, a radio wave signal needs to reach a location of a mobile station apparatus physically remote therefrom and therefore, it is necessary to considerably amplify the signal by an amplifier. However, an amplifier is an analog devise and therefore, an input/output characteristic thereof becomes a nonlinear function. Particularly, at and after an amplification limit referred to as saturated point, even when power inputted to the amplifier is increased, an output power substantially becomes constant. Further, a nonlinear distortion is generated by the nonlinear output. Although a signal component of a transmitting signal out of a desired signal band before amplification is restrained to a low level by a band restricting filter, a nonlinear distortion is generated in the signal after passing the amplifier and the signal component is leaked to outside of the desired signal band (contiguous channel). For example, since transmitting power is high as described above in, for example, the base station apparatus, a magnitude of the power leaked to the contiguous channel is strictly rectified and there poses a serious problem by how to reduce the power leaked to the contiguous channel.

As one of distortion compensating systems, there is a predistortion system, in recent years, importance is given to an amplification efficiency and therefore, the predistortion system is becoming a main current in place of a feed forward system. The predistortion system is a system of compensating for a distortion of an output signal of an amplifier by previously providing an inverse characteristic of AM-AM conversion and AM-PM conversion constituting a nonlinear characteristic of the amplifier.

Figure 6:
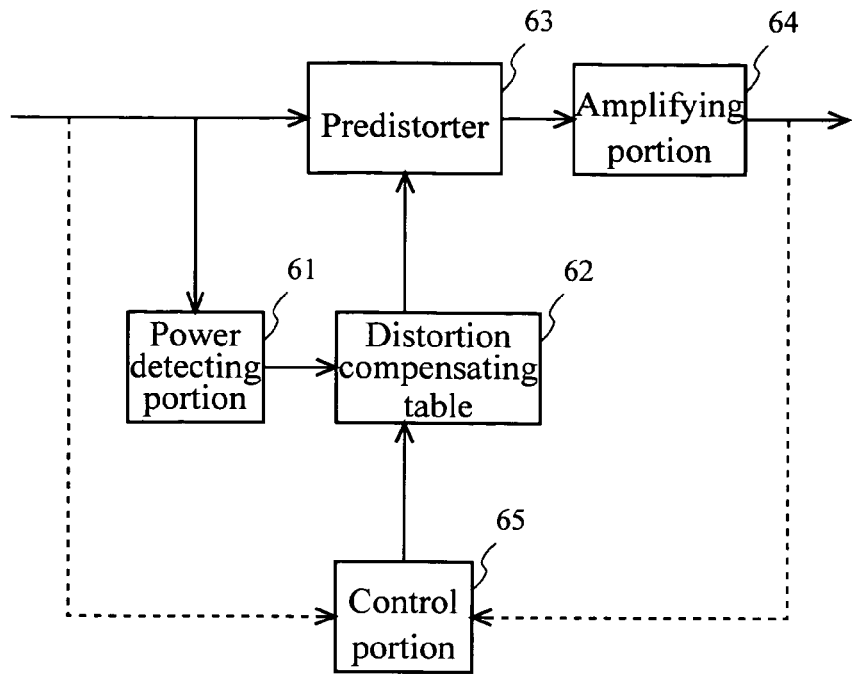
FIG. 6 is a diagram showing a constitution example of an amplifier having a distortion compensating function.

FIG. 6 shows a functional block diagram of an amplifier using a predistortion system (amplifier having predistortion system distortion compensating function) and operation thereof will be explained.

An amplifier shown in FIG. 6 is provided with a power detecting portion 61, a distortion compensating table 62 constituting a look up table (LUT) constituted by, for example, a memory, a predistorter 63, an amplifying portion 64 and a control portion 65.

An input signal is inputted to the power detecting portion 61 and a power or an amplitude thereof is detected by the power detecting portion 61, and a result of the detection is corresponded as a reference number of the distortion compensating table 62 constituted by the memory or the like. The distortion compensating table 62 is stored with a table value for compensating for a distortion by the predistortion system. The table value shows an inverse characteristic of a nonlinear characteristic of the amplifier (amplifying portion 64) constituting an object of compensation, and generally corresponds to AM-AM conversion (amplitude) and AM-PM conversion (phase) constituting an index by the power or the amplitude of the input signal. The predistorter 63 controls the amplitude and the phase of the input signal in accordance with a result of reference of the distortion compensating table 62. A signal previously distorted by the predistortion system by the predistorter 63 is amplified by the amplifying portion 64 and an output signal therefrom becomes a signal without distortion. The control portion 65 updates the table value of the distortion compensating table 62 to adapt to an environment of a change in temperature or the like.

However, according to a mechanism of generating a distortion of an amplifier, not only the distortion is changed by an AM-AM characteristic and an AM-PM characteristic of an instantaneous power but a current state thereof is changed by a past state as represented by a memory effect. According to the background art, an index for referring a distortion compensating table is only an instantaneous power. Therefore, there poses a problem that a nonlinear distortion generated by the memory effect cannot be compensated for by a method of the background art.

In order to resolve the problem, as an easily conceivable method, there is provided a distortion compensating table constituting reference numbers by a current instantaneous power and an instantaneous power before one time period (one sample).

Figure 7:
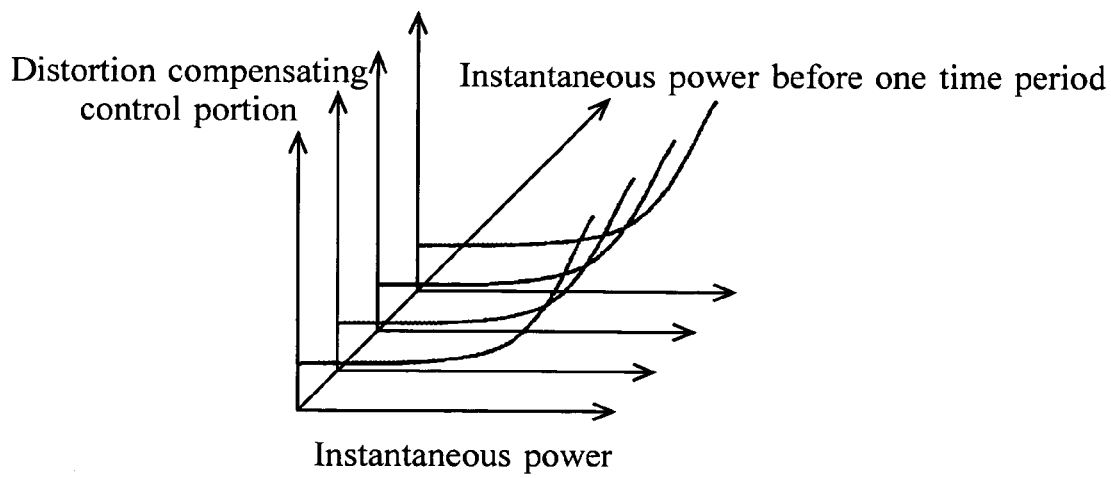
FIG. 7 is a view showing an example of a distortion compensation table for compensating for a memory effect.

FIG. 7 shows an example of an image of such a distortion compensating table. The abscissa designates an instantaneous power and the ordinate designates a distortion compensation control value. This is because a dimension of the instantaneous power before one time period is increased in the distortion compensating table heretofor. For example, when a resolution of the instantaneous power is 10 bits, 1024 sheets of the tables heretofor are needed. Although when constituted in this way, the distortion can be compensated for, when such a constitution is adopted, a memory amount becomes enormous and learning to adapt to generation of the table and an environment thereof is realistically impossible.

As an example, there is conceived a model constitution of the amplifying portion 64 as shown by FIG. 8. The constitution is an example of the amplifier model in consideration of an influence of a memory effect and is an example of a parallel constitution. A distortion by a memory effect cannot be compensated for by an inverse characteristic of an AM-AM characteristic and an AM-PM characteristic constituting a principle of the predistortion.

A total of the constitution shown in FIG. 8 corresponds to the amplifying portion 64. Since this is a model, respective portions attached with notations 71 through 78 are not necessarily constituent elements existing at inside of the amplifying portion 64.

The model shown in FIG. 8 is provided with an amplifying portion 71, a fixed phase changer 72, a square circuit 73, a delay element 74, an adder 75, a multiplier 76 a multiplier 77, and an adder 78. Further, as the multipliers 76 and 77, for example, a complex multiplier is used.

The amplifying portion 71 is an amplifying portion for generating a nonlinear distortion y (x) having only an AM-AM characteristic and an AM-PM characteristic of the background art. With regard to the amplifying portion 71, a distortion can completely be compensated for by the principle of the predistortion. The square circuit 73 generates a secondary distortion element of an input signal of the amplifier generated at a base band by squaring the input signal. With regard to the secondary distortion component, a difference between the signal and a signal delayed by the delay element 74 is calculated at the adder 75. This corresponds to differentiation by an inductance component and corresponds to a variation in voltage of a bias circuit. The multiplier 76 multiplies the difference by the predetermined value φ1 and a result thereof corresponds to a degree of influence of the memory effect. Meanwhile, the input signal is subjected to phase variation by a constant (fixed value φ1) at the fixed phase changer 72, and by multiplying a result thereof by an output from the multiplier 76 by the multiplier 77, the result is remodulated by the variation in the voltage of the bias circuit. A signal of a result of the multiplication is added to an output signal (output signal from amplifying portion 71) of the amplifier model of the background art by the adder 78 as a memory effect component z (x) for the input signal x.

Further, by constituting the predetermined value α1, the fixed phase changer 72 for providing a change in the phase of the fixed value φ1 can also be omitted.

As other example, there is conceived a model constitution of the amplifying portion 64 as shown by FIG. 9. This is an example of an amplifier model in consideration of an effect of a memory effect and is an example of a series constitution. A distortion by a memory effect cannot be compensated for by an inverse characteristic of an AM-AM characteristic and an AM-PM characteristic constituting the principle of the predistortion.

A total of a constitution shown in FIG. 9 corresponds to the amplifying portion 64. Since the constitution is a model, respective portions attached with notations 81 through 87 are not necessarily constituent elements existing at inside of the amplifying portion 64.

A model shown by FIG. 9 is provided with an amplifying portion 81, a square circuit 82, a delay element 83, an adder 84, a multiplier 85, a multiplier 86, and an adder 87. Further, as the multipliers 85, 86, for example, complex multipliers are used.

The amplifying portion 81 is an amplifying portion for generating a nonlinear distortion y (x) having only the AM-AM characterstic and the AM-PM characteristic of the background art for an input signal x. With regard to the amplifying portion 81, a distortion can completely be compensated for by the principle of the predistortion. The square circuit 82 squares a signal outputted from the amplifying portion 81 and generates a secondary distortion component of the signal outputted from the amplifying portion 81. With regard to the secondary distortion component, a difference between the signal and a signal delayed by the delay element 83 is calculated by the adder 84. The result corresponds to differentiation by an inductance component and corresponds to a variation in voltage of a bias circuit. The multiplier 85 multiplies the difference by a predetermined value α2 and the result corresponds to a degree of influence of the memory effect. Further, the output signal from the amplifying portion 81 is multiplied by an output signal from the multiplier 85 by the multiplier 86 and by subtracting a signal of a result of the multiplication from an output signal of the amplifier model of the background art (output signal from the amplifying portion 81) by the adder 87, a memory effect component z (x') for an output x' from the amplifying portion 81 is added.

Although in FIG. 8 and FIG. 9, only the secondary component is taken into consideration as an example of a mechanism of generating the memory effect, generally, even-order distortion components of a fourth order, a sixth order and the like are generated at the base band and therefore, similar bias components are generated. In such a case, portions in correspondence with the square circuits 73, 82 in FIG. 8 and FIG. 9 respectively become fourth power circuits, sixth power circuits or the like and the memory effect component is added to the output of the amplifier model of the background art. The distortion component by the memory effect cannot be compensated for by the predistorter constituting the reference number only by the instantaneous power.

Figure 10:
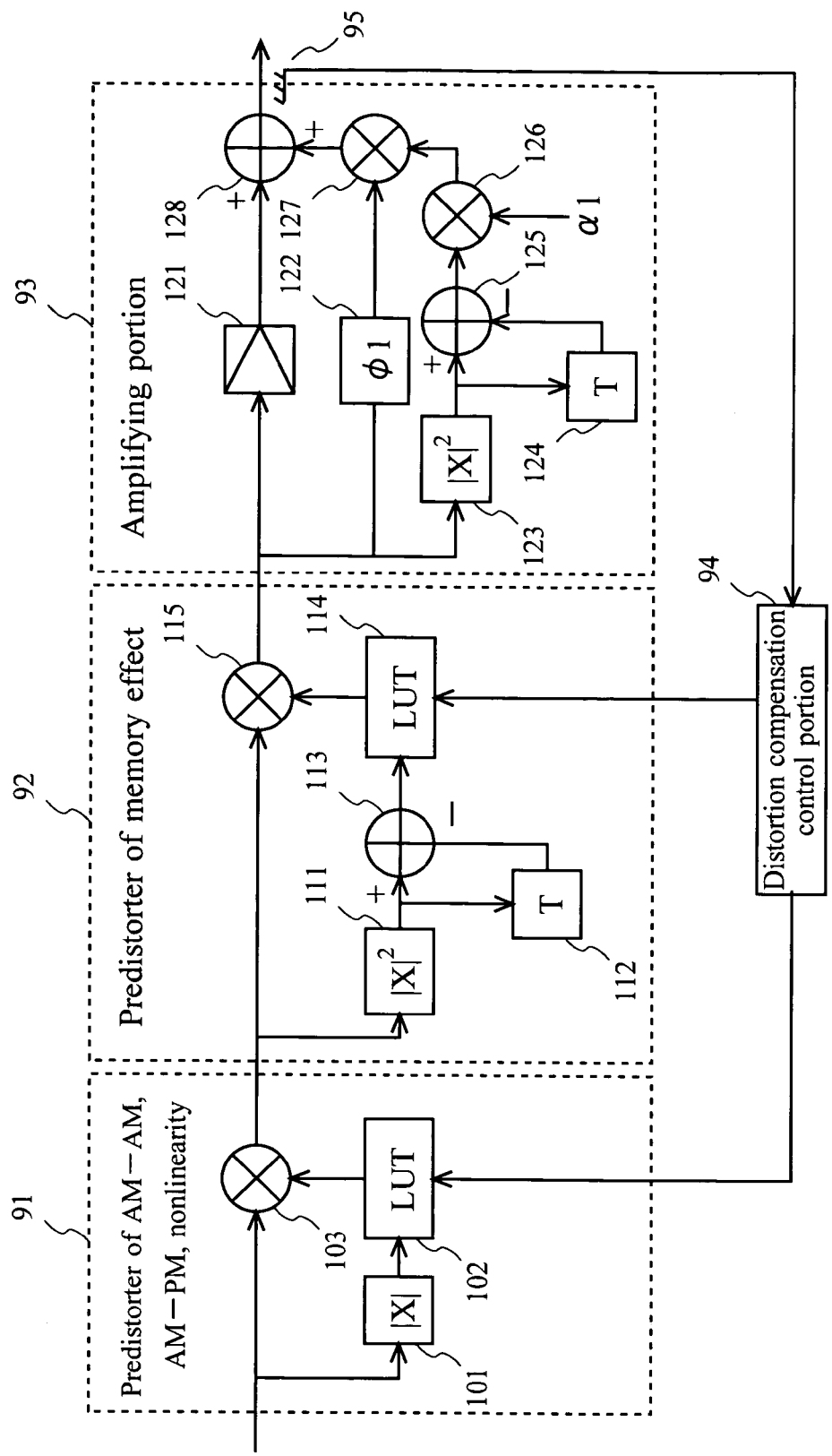
FIG. 10 is a diagram showing a constitution example of an amplifier having a memory effect compensating function.

FIG. 10 shows a constitution example of an amplifier having a memory effect compensating function.

An amplifier having a memory effect compensating function shown in FIG. 10 is provided with a predistorter 91 of a nonlinear distortion of an AM-AM characteristic and an AM-PM characteristic, a predistorter 92 of a memory effect, an amplifying portion 93 and a distortion compensation control portion 94.

The predistorter 91 of the nonlinear distortion is provided with an envelope detecting circuit 101, a distortion compensation table 102, and a multiplier 103. Further, as the multiplier 103, for example, a complex multiplier is used.

The predistorter 92 of the memory effect is provided with a square circuit 111, a delay element 112, a subtracter 113, a memory effect compensating table 114 constituted by a LUT and a multiplier 115. Further, as the multiplier 115, for example, a complex multiplier is used. Further, a subtracter for subtracting other signal from one signal can also be regarded as an adder for providing a result the same as that of subtraction by adding one signal and other signal by phases inverse to each other.

The amplifying portion 93 is provided with an amplifying portion 121, a fixed phase changer 122, a square circuit 123, a delay element 124, an adder 125, a multiplier 126, a multiplier 127 and an adder 128 similar to, for example, the constitution shown in FIG. 8. Further, as the multipliers 126, 127, for example, complex multipliers are used.

The predistorter 91 of the nonlinear distortion compensates for the nonlinear distortion of the AM-AM characteristic and the AM-PM characteristic. The envelope detecting circuit 101 detects a voltage or a power of an envelope of an input signal and an output thereof corresponds to the instantaneous power. By using a distortion compensating coefficient stored to the distortion compensation table 102 by constituting a reference number by the output and subjecting the distortion compensation coefficient and the input signal to complex multiplication by the multiplier 103, an inverse characteristic of the AM-AM characteristic and the AM-PM characteristic is provided for the input signal. An output from the multiplier 103 is outputted to the predistorter 92 of the memory effect. A table value of the distortion compensation table 402 is automatically updated and converged based on an output signal from the amplifying portion 93.

The predistorter 92 of the memory effect compensates for the distortion by the memory effect by inputting the output signal from the predistorter 91 of the nonlinear distortion. The square circuit (second-order detecting portion) 111 detects a square value of the input signal. The square value is normally calculated by $(I^2+Q^2)$ when an I component of the signal is designated by notation I and a Q component thereof is designated by notation Q. The delay element (delay circuit) 112 delays an output from the square circuit 111 by a predetermined time period T [sec]. The subtracter 113 subtracts an output from the delay element 112 (output from the square circuit 111 before T [sec]) from an output from the square circuit 111. Here, when time is designated by notation t, an I component of an input signal is designated by notation I (t) and a Q component thereof is designated by notation Q (t), an output from the subtracter 113 corresponds to an amount of a square difference presented by $\{|I(t)^2 + Q(t)^2| - |I(t-T)^2 + Q(t-T)^2|\}$. The memory effect compensating table 114 is stored with a table value for compensating for the distortion by the memory effect and a reference number of the table is constituted by the output from the subtracter 113. By reading a complex vector for compensating for a distortion stored to the memory effect compensating table 114 in accordance with the output from the subtracter 113 and subjecting the complex vector and the output signal from the multiplier 103 from the predistorter 91 of the nonlinear distortion to complex multiplication by the multiplier 115, the distortion by the memory effect is compensated for with regard to the input signal. An output from the multiplier 115 is outputted to the amplifying portion 93. A table value of the memory effect compensating table 114 is automatically updated and converged based on the output signal from the amplifying portion 93.

The amplifying portion 93 inputs a signal outputted from the multiplier 115 of the predistorter of the memory effect and amplifies the input signal to output. Operation of the respective processing portions 121 through 128 provided to the amplifying portion 93 is similar to that shown by, for example, FIG. 8. At the amplifying portion 93, the nonlinear distortion by the AM-AM characteristic and the AM-PM characteristic is generated, the distortion by the memory effect is generated, and the respective distortions are compensated for by the distortion generated by the predistorter 91 of the nonlinear distortion and the distortion generated by the predistorter 92 of the memory effect.

Further, a portion of an output signal from the adder 128 of the amplifying portion 93 is outputted by the directional coupler 95 and inputted to the distortion compensation control portion 94 and a feedback control is executed for the distortion compensating table 102 and the memory effect compensating table 114.

However, there poses a problem that distortion cannot completely be compensated for by the above-described predistorter and the problem will be explained as follows.

Figure 11:
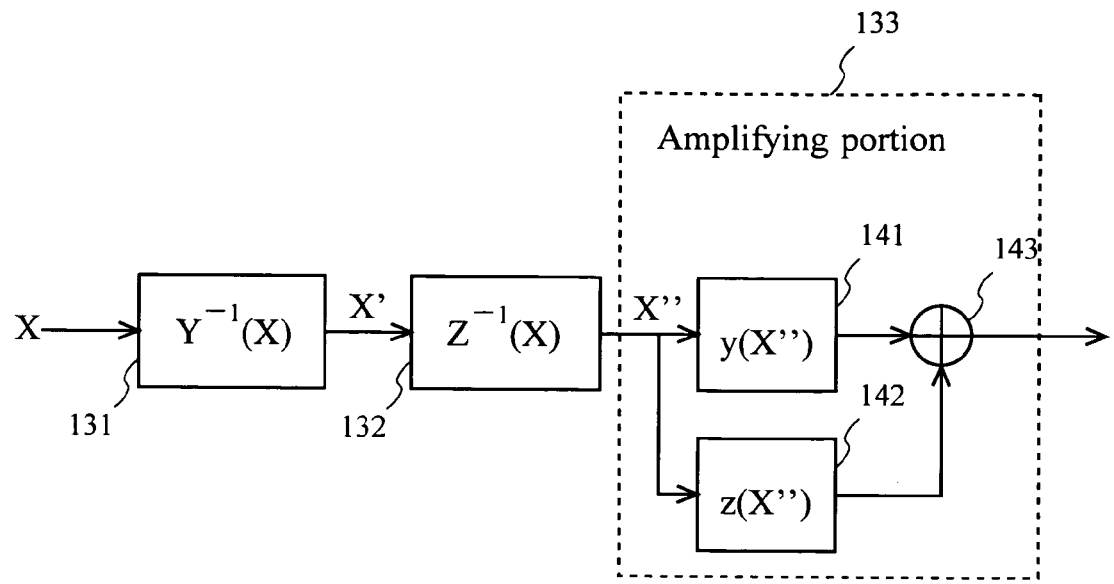
FIG. 11 is a diagram showing a constitution example of an amplifier having a memory effect compensating function having a series constitution.

FIG. 11 shows a constitution example of an amplifier having a memory effect compensating function connected in series with a nonlinear predistorter 131 of an AM-AM characteristic and an AM-PM characteristic and a predistorter 132 of an memory effect and further connected in series with an amplifying portion 133.

The predistorter 131 of the nonlinear shape outputs a signal $Y^{-1}$ (X') providing the distortion of the AM-AM characteristic and the AM-PM characteristic for an input signal X.

The predistorter 132 of the memory effect outputs a signal $Z^{-1}$ (X') providing the distortion by the memory effect for an input signal $X'=Y^{-1}$ (X).

The amplifying portion 133 outputs a signal Y (X") providing the nonlinear distortion of the AM-AM characteristic and the AM-PM characteristic for an input signal $X''=Z^{-1}$ (X') at a nonlinear distortion generating portion 141 of the AM-AM characteristic and the AM-PM characteristic, outputs signal z (X") providing the distortion by the memory effect for the input signal $X''=Z^{-1}$ (X') at a memory effect distortion generating portion 142, adds the two outputs at an adder 143 and outputs a result of the addition $\{y(X'')+z(X'')\}$.

Here, when an input signal to the nonlinear predistorter 131 is designated by notation X, and when assumedly, the output signal $Y^{-1}$ (X) from the nonlinear predistorter 131 is an input signal to the amplifying portion 133, an output from the nonlinear distortion generating portion 141 of the amplifying portion 133 becomes an amplifier signal without distortion. That is, when a gain is designated by notation Gain, y $(Y^{-1}(X))$=Gain×X.

Further, when assumedly, the input signal to the predistorter 132 of the memory effect is designated by notation X and an output signal $Z^{-1}(X)$ from the predistorter 132 of the memory effect is an input signal to the amplifying portion 133, an output from the memory effect distortion generating portion 142 of the amplifying portion 133 becomes zero (0) compensating for the memory effect. That is, z $(Z^{-1}(X))$=0.

However, actually, the input signal to the nonlinear distortion generating portion 141 and the memory effect distortion generating portion. 142 of the amplifying portion 133 becomes $Z^{-1}(Y^{-1}(X))$ and the predetermined distortions α, β remain. That is, $y(Z^{-1}(Y^{-1}(X))$=Gain×X+α and $Z^{-1}(Y^{-1}(X))$=β.

When a pertinent algorithm or the like is used, although an optimum solution of $z^{-1}(Y^{-1}(X))$ minimizing the distortion (α+β) can be found, the distortion cannot completely be compensated for, that is, (α+β) cannot become zero (0).

Figure 12:
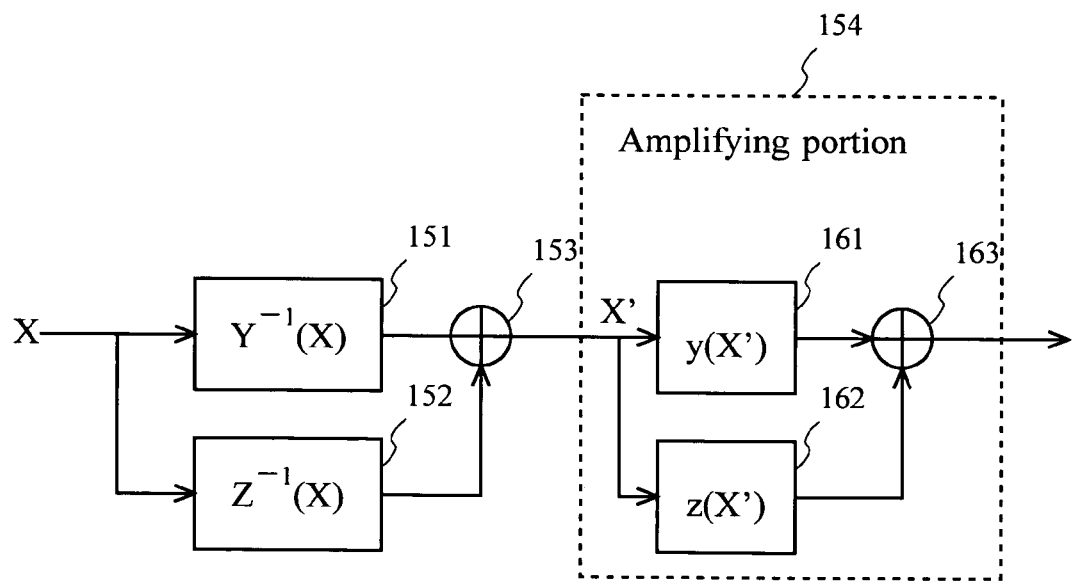
FIG. 12 is a diagram showing a constitution example of an amplifier having a memory effect compensating function having a parallel constitution.

FIG. 12 shows a constitution example of an amplifier having a memory effect compensating function connected in parallel with a nonlinear predistorter 151 of an AM-AM characteristic and an AM-PM characteristic and a predistorter 152 of a memory effect to connect to an adder 153 and further connected in parallel with an amplifying portion 154.

The nonlinear predistorter 151 outputs a signal $Y^{-1}(X)$ providing the nonlinear distortion of the AM-AM characteristic and the AM-PM characteristic for an input signal X.

The predistorter 152 of the memory effect outputs a signal $Z^{-1}(X)$ providing the distortion by the memory effect for the input signal X.

The adder 153 adds the two output signals and outputs a result of the addition X'={$Y^{-1}(X)+Z^{-1}(X)$} to the amplifying portion 154.

The amplifying portion 154 outputs a signal y (X') providing the nonlinear distortion of the AM-AM characteristic and the AM-PM characteristic for an input signal X' at a nonlinear distortion generating portion 161 of the AM-AM characteristic and the AM-PM characteristic, outputs a signal z (X') providing the distortion by the memory effect for the input signal X' at a memory effect distortion generating portion 162, adds the two outputs at an adder 163 and outputs a result of the addition {y (X')+Z (X')}.

Also in the constitution, similar to the constitution shown in FIG. 11, the distortion cannot completely be compensated for.

In this way, according to the background art, an inverse characteristic (inverse function) of a distortion of a total of the amplifying portion cannot be expressed and an error is brought about in compensating for the distortion.

In contrast thereto, according to the invention, the distortion by the AM-AM characteristic and the AM-PM characteristic generated at the amplifying portion and the distortion by the memory effect can effectively be compensated for.

Here, as constitutions of the predistorter, the amplifier apparatus having the predistorter and the like according to the invention are not necessarily limited to the above-described but various constitutions may be used therefor. Further, the invention can be provided also as a method or a system for executing a processing according to the invention, a program for realizing the method or the system or a record medium for recording the program or the like, further, can also be provided as various apparatus or systems.

Further, a field of applying the invention is not necessarily limited to the above-described but the invention is applicable to various fields.

Further, as various processings executed in the predistorter or the amplifying apparatus having the predistorter according to the invention, there may be used a constitution in which in a hardware resource having a processor, a memory or the like, the processor is controlled by executing a control program stored to ROM (Read Only Memory), further, the invention may be constituted, for example, as a hardware circuit in which respective function means for executing the processing are independent from each other.

Further, the invention can also be grasped as a record medium readable by a computer of a floppy (registered trade mark) disk, CD (Compact Disc)-ROM or the like stored with the above-described control program or the program (per se), and a processing according to the invention can be executed by inputting the control program from the control medium to a computer to make a processor execute the control program.

What is claimed is:

1. A predistorter for compensating for a distortion generated at an amplifier by inputting a signal to be inputted to the amplifier constituting an object of compensating for the distortion and previously providing the distortion to the input signal, said predistorter comprising:
   amplifier replica means having an input/output characteristic the same as an input/output characteristic of the amplifier or an input/output characteristic approximated thereto for inputting a signal to output;
   difference detecting means for detecting a difference between an input signal to the predistorter and an output signal from the amplifier replica means;
   amplifier replica input signal changing means for changing the signal inputted to the amplifier replica such that a difference detected by the difference detecting means is reduced; and
   change signal outputting means for outputting the signal changed by the amplifier replica input signal changing means to the amplifier.

2. The predistorter according to claim 1, wherein the amplifier replica means is constituted by an amplifier replica using digital processing, the difference detecting means is constituted by a comparator, and the amplifier replica input signal changing means and the change signal outputting means are constituted by a distortion compensation control portion.

3. The predistorter according to claim 1, wherein the amplifier replica means is constituted by an amplifier replica using digital processing, the difference detecting means is constituted by a first adder, and the amplifier replica input signal changing means and the change signal outputting means are constituted by a multiplier for multiplying an output from the first adder by a predetermined value, a delay portion for delaying a signal the same as an input signal to the amplifier replica, a second adder for subtracting an output of the multiplier from an output of the delay portion, a switch at a prestage of the amplifier replica and the delay portion, and a switch at a post stage of the second adder.

4. The predistorter according to claim 1, further comprising:
   distortion detecting means for detecting a distortion included in a signal outputted from the amplifier based on the signal; and
   amplifier replica parameter updating means for updating a parameter for changing the input/output characteristic provided to the amplifier replica means such that the distortion detected by the distortion detecting means is reduced.

5. The predistorter according to claim 4 wherein the distortion detecting means comprises a directional coupler and a distortion compensation control portion and the amplifier replica parameter updating means comprises a distortion compensation control portion.

6. The predistorter according to claim 4, wherein the distortion detecting means comprises a directional coupler, a feedback block and a DSP, and the amplifier replica parameter updating means is constituted by the DSP.

7. The predistorter according to claim 1, further comprising:
subpredistorter means for compensating for a distortion of the input signal from an input end of the predistorter by a predistortion system and outputting a signal the distortion of which has been compensated for to sides of the amplifier replica input signal changing means and the amplifier replica means.

8. The predistorter according to claim 1, wherein a plurality of distortion compensating units having the amplifier replica means, the difference detecting means and the amplifier replica input signal changing means are provided to connect in series;
wherein the change signal outputting means outputs a signal changed by the amplifier replica input signal changing means at a final stage of the distortion compensating unit to the amplifier; and
wherein the predistorter comprises subpredistorter means for providing a predistortion to the input signal at each sampling period of the input signal to the predistorter and constituting a signal provided with the predistortion as an input signal to the amplifier replica means at an initial stage of the distortion compensating unit.

9. The predistorter according to claim 4, wherein a plurality of distortion compensating units having the amplifier replica means, the difference detecting means and the amplifier replica input signal changing means are provided to connect in series;
wherein the change signal outputting means outputs a signal changed by the amplifier replica input signal changing means at a final stage of distortion compensating unit to the amplifier; and
wherein the predistorter comprises subpredistorter means for providing a predistortion to the input signal at each sampling period of the input signal to the predistorter and constituting a signal provided with the predistortion as an input signal to the amplifier replica means at an initial stage of the distortion compensating unit.

10. The predistorter according to claim 1, wherein the amplifier replica means includes a function of realizing a characteristic the same as an AM-AM characteristic and an AM-PM characteristic of the amplifier or a characteristic approximated thereto and a function of realizing a characteristic the same as a characteristic of a memory effect of the amplifier or a characteristic approximated thereto.

11. The predistorter according to claim 4, wherein the amplifier replica means includes a function of realizing a characteristic the same as an AM-AM characteristic and an AM-PM characteristic of the amplifier or a characteristic approximated thereto and a function of realizing a characteristic the same as a characteristic of a memory effect of the amplifier or a characteristic approximated thereto.

12. The predistorter according to claim 1, wherein the input signal to the predistorter is a signal of a base band or an intermediate frequency, the amplifier is an amplifier for transmitting a radio wave, and a mean gain of the amplifier replica means is at a zero decibel or substantially at a zero decibel as an input/output characteristic the same as an input/output characteristic of the amplifier or an input/output characteristic approximated thereto.

13. The predistorter according to claim 4, wherein the input signal to the predistorter is a signal of a base band or an intermediate frequency, the amplifier is an amplifier for transmitting a radio wave, and a mean gain of the amplifier replica means is at a zero decibel or substantially at a zero decibel as an input/output characteristic the same as an input/output characteristic of the amplifier or an input/output characteristic approximated thereto.

14. The predistorter according to claim 1, wherein the predistorter is provided at a base station apparatus of a mobile communication system for compensating for a distortion generated at an amplifier provided to a transmitter of the base station apparatus.

* * * * *